United States Patent
Chen et al.

(10) Patent No.: US 10,818,221 B2
(45) Date of Patent: Oct. 27, 2020

(54) DISPLAY PANEL AND DISPLAY DEVICE

(71) Applicant: Xiamen Tianma Micro-Electronics Co., Ltd., Xiamen (CN)

(72) Inventors: Zhonghuai Chen, Xiamen (CN); Zhiwei Zheng, Xiamen (CN); Zhipeng Huang, Xiamen (CN); Ying Sun, Xiamen (CN); Yumin Xu, Xiamen (CN)

(73) Assignee: Xiamen Tianma Micro-Electronics Co., Ltd., Xiamen (CN)

( * ) Notice: Subject to any disclaimer, the term of this patent is extended or adjusted under 35 U.S.C. 154(b) by 133 days.

(21) Appl. No.: 16/177,979

(22) Filed: Nov. 1, 2018

(65) Prior Publication Data

US 2020/0005701 A1   Jan. 2, 2020

(30) Foreign Application Priority Data

Jun. 29, 2018 (CN) .......................... 2018 1 0696099

(51) Int. Cl.
*G11C 19/28* (2006.01)
*G09G 3/20* (2006.01)
*G06K 9/00* (2006.01)

(52) U.S. Cl.
CPC ....... *G09G 3/2092* (2013.01); *G06K 9/00013* (2013.01); *G11C 19/287* (2013.01); *G09G 2300/0426* (2013.01); *G09G 2310/0283* (2013.01); *G09G 2310/0286* (2013.01); *G09G 2330/021* (2013.01)

(58) Field of Classification Search
CPC ......... G09G 3/2092; G09G 2300/0426; G09G 2310/0283; G09G 2310/0286; G09G 2330/021; G06K 9/00013; G11C 19/287
See application file for complete search history.

(56) References Cited

U.S. PATENT DOCUMENTS

| | | | | |
|---|---|---|---|---|
| 2013/0077736 A1* | 3/2013 | Son | ....................... | G09G 3/2085 377/69 |
| 2013/0083885 A1* | 4/2013 | Lee | ........................ | G11C 19/28 377/69 |
| 2014/0198136 A1* | 7/2014 | Lee | ....................... | G09G 3/3233 345/690 |
| 2017/0285846 A1* | 10/2017 | Mizuhashi | .............. | G06F 3/044 |

FOREIGN PATENT DOCUMENTS

| CN | 107272244 A | 10/2017 |
|---|---|---|
| CN | 107346650 A | 11/2017 |

* cited by examiner

*Primary Examiner* — Parul H Gupta

(74) *Attorney, Agent, or Firm* — Miller, Matthias & Hull LLP

(57) ABSTRACT

Provided are a display panel and display device. The display panel includes a display area and a non-display area. The display panel further includes multiple cascaded shift registers disposed in the non-display area and multiple scanning lines disposed in the display area. Each shift register is connected to a corresponding scanning line. The shift registers include multiple first shift registers and multiple second shift registers. The first shift registers are capable of unidirectional scanning, and the second shift registers are capable of bidirectional scanning. The display area includes a first display area and a second display area. Each of scanning lines in the first display area are connected to a respective one of the plurality of first shift registers, and each of the at least part of the scanning lines in the second display area are connected to the second shift registers.

17 Claims, 26 Drawing Sheets

DISPLAY PANEL AND DISPLAY DEVICE

CROSS-REFERENCE TO RELATED APPLICATIONS

This application claims priority to a Chinese patent application No. 201810696099.1 filed on Jun. 29, 2018, the disclosure of which is incorporated herein by reference in its entirety.

TECHNICAL FIELD

The present disclosure relates to display technologies, and in particular relates to a display panel and a display device.

BACKGROUND

With the development of the display technology, display devices will possess more and more functions. To achieve the corresponding functions, display in a partial display area of the display panel may need to be driven. For example, a display area of the display panel further includes a special-shaped display area, and shift registers provide scanning signals for scanning lines of the display area to turn on pixels in the display area. If only the special-shaped display area needs to be driven to display information, not only shift registers that drive the special-shaped display area work, but other shift registers that drive areas outside the special-shaped display area also work. That is, all shift registers work, thereby increasing power consumption of the display panel.

SUMMARY

The present disclosure provides a display panel and display device to reduce power consumption of the display panel.

In a first aspect, an embodiment of the present disclosure provides a display panel. The display panel includes a display area and a non-display area. The display panel further includes multiple cascaded shift registers disposed in the non-display area and multiple scanning lines disposed in the display area. Each shift register is connected to a corresponding scanning line. The shift registers include multiple first shift registers and multiple second shift registers. The first shift registers are capable of unidirectional scanning, and the second shift registers are capable of bidirectional scanning.

The display area includes a first display area and a second display area. Each of scanning lines in the first display area is connected to a respective one of the plurality of first shift registers, and each of the at least part of the scanning lines in the second display area is connected to a respective one of the plurality of second shift registers.

In a second aspect, an embodiment of the present disclosure provides a display device. The display device includes the display panel in any one of the embodiments of the present disclosure.

In the technical solution of the present disclosure, the first shift registers are capable of unidirectional scanning, and the second shift registers are capable of bidirectional scanning. When the first display area and the second display area both need to display information, the first shift registers can be triggered and controlled to scan along a first direction. After the scanning of the first shift registers is completed, a last-stage first shift register that completes the scanning may trigger the second shift registers to output scanning signals, the second shift registers scan along the first direction. When only the second shift registers need to scan, the display function or other functions of the second display area are completed. For example, the second shift registers drive fingerprint sensing units to perform fingerprint identification, trigger and control the second shift registers to scan along a second direction. The first direction is opposite to the second direction. Only the second shift registers are working in this process to reduce the power consumption of the display panel.

DETAILED DESCRIPTION

Figure 1:
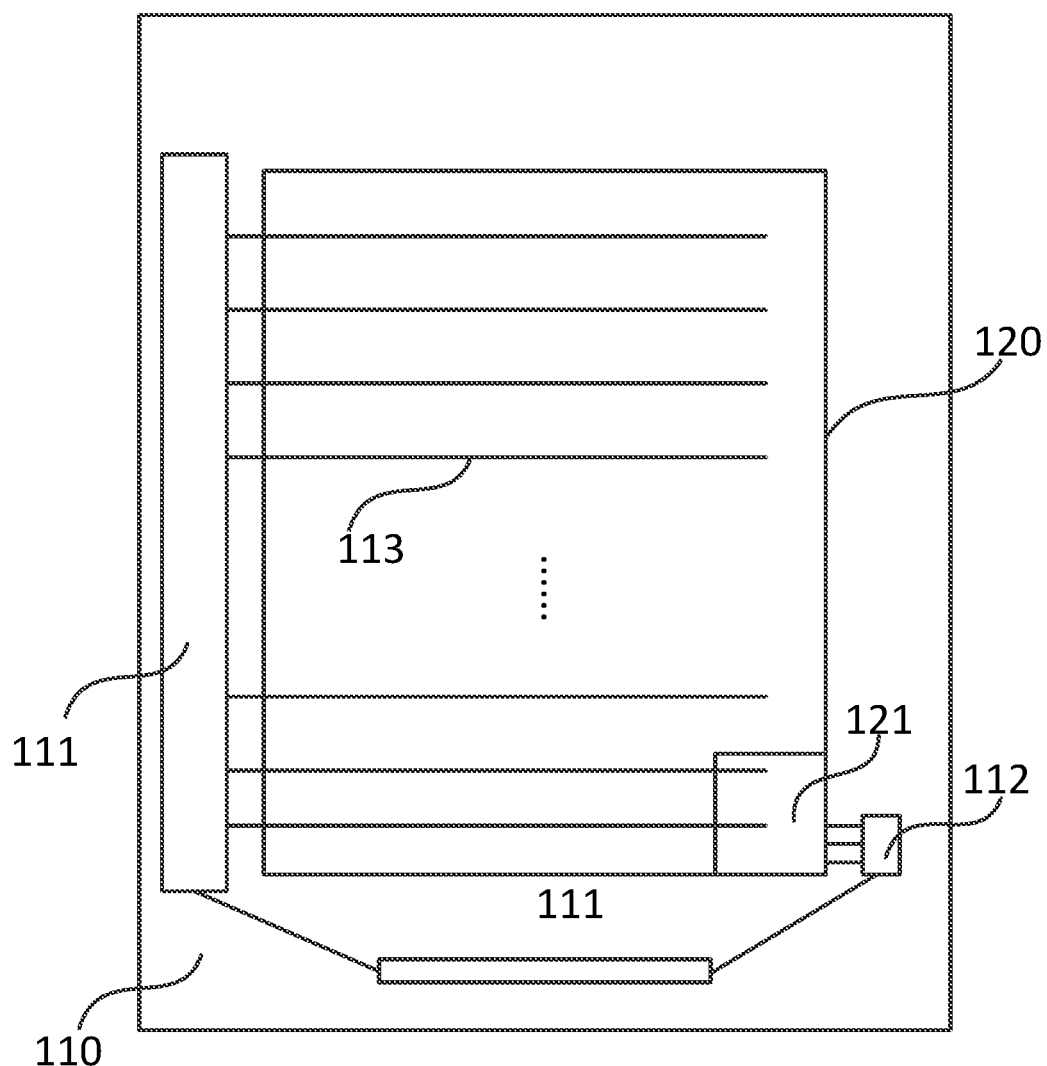
FIG. 1 is a structural diagram of a display panel in related arts.

The present disclosure will be further described in detail with reference to the accompanying drawings and embodiments. It is to be understood that the embodiments set forth below are intended to illustrate and not to limit the present disclosure. Additionally, it is to be noted that to facilitate the description, merely a part of structures related to the present disclosure rather than the whole structure are illustrated in the drawings.

FIG. 1 is a structural diagram of a display panel in related arts. As shown in FIG. 1, in related arts the display panel provided with fingerprint identification within the panel includes a display area 120 and a non-display area 110. In addition to pixel units, the display area 120 further includes a fingerprint identification module 121, the fingerprint identification module 121 includes multiple fingerprint identification units arranged in an array and configured to identify fingerprints. The non-display area 110 includes a first scanning drive circuit 111 configured to drive the pixel units, and a second scanning drive circuit 112 configured to drive the fingerprint identification module 121. The first scanning drive circuit 111 and the second scanning drive circuit 112 are both connected to corresponding pixel units or the fingerprint identification module 121 via driving scan lines 113. The second scanning drive circuit 112 is additionally configured, thereby increasing a total number of scanning drive circuits in the display panel so as to increase a frame width of the display panel.

Figure 2:
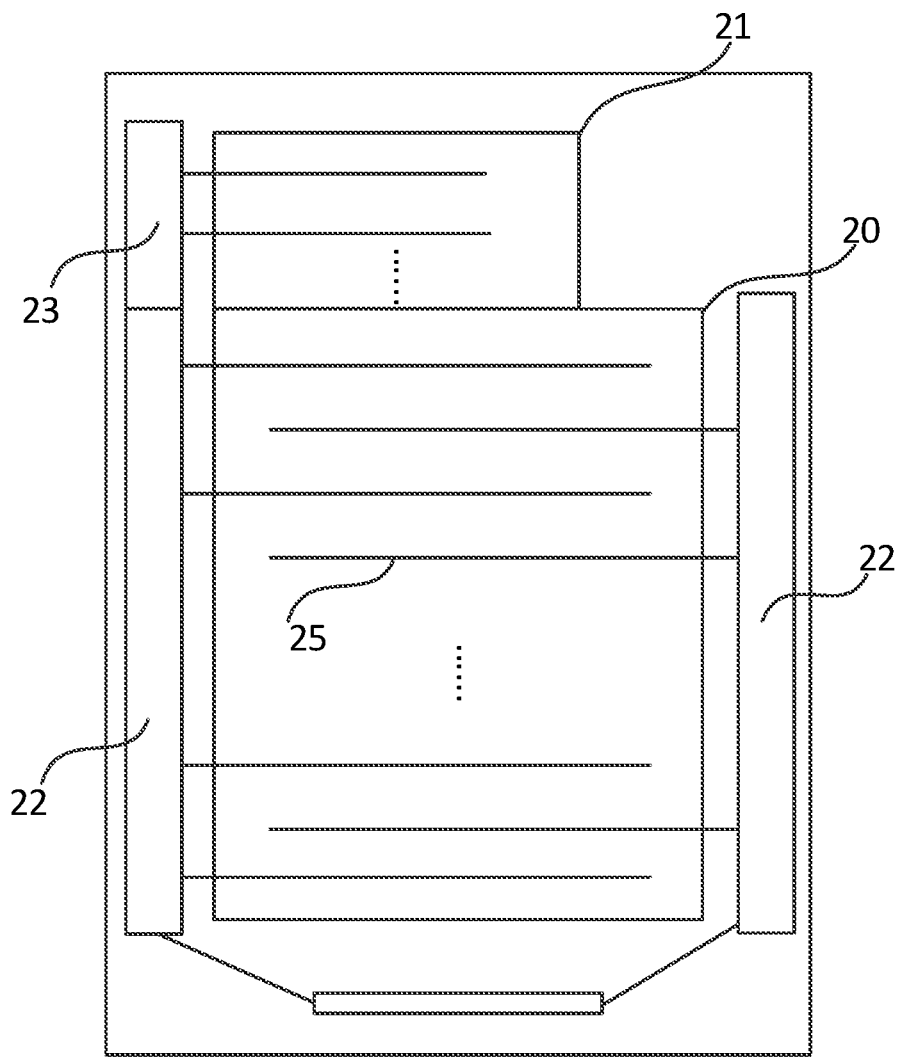
FIG. 2 is a structural diagram of another display panel in related arts.

FIG. 2 is a structural diagram of another display panel in related arts. As shown in FIG. 2, the display panel includes a normal display area 20 and a special-shaped display area 21. The display panel includes a third scanning drive circuit 22 configured to drive the normal display area 20 and a fourth scanning drive circuit 23 configured to drive the special-shaped display area 21. The third scanning drive circuit 22 and the fourth scanning drive circuit 23 are both connected to the corresponding pixel units via driving scan lines 25. When the display panel only needs the special-shaped display area 21 to display, the fourth scanning drive circuit 23 configured to drive the special-shaped display area 21 and the third scanning drive circuit 22 configured to drive the normal display area 20 in the display panel both need to work, thereby increasing the power consumption of the display panel. Also, in a case of the special-shaped display area 21, within a frame time of displaying, a driving time of the third scanning drive circuit 22 driving the normal display area 20 is longer and dead time of the special-shaped display area 21 is longer.

Figure 3:
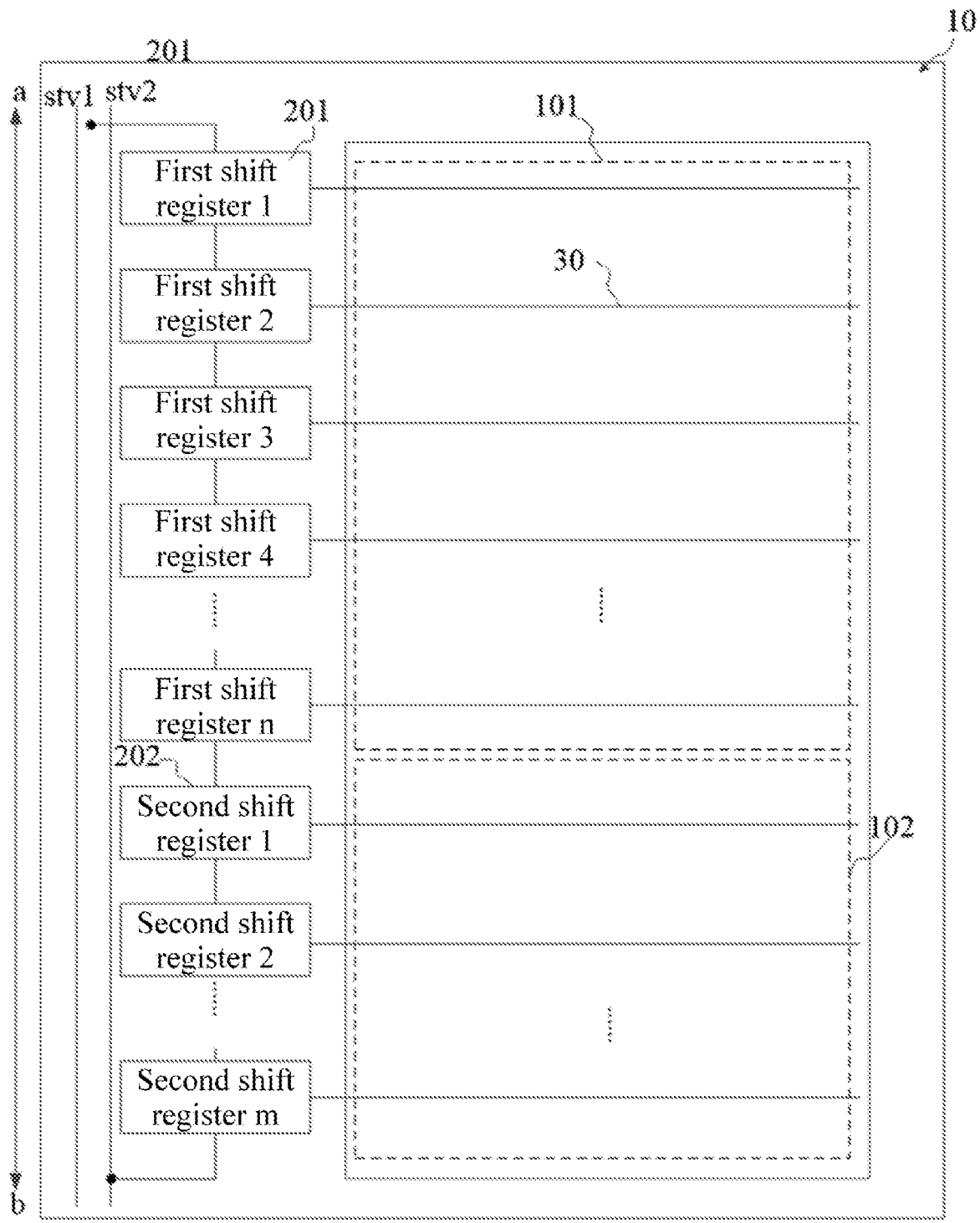
FIG. 3 is a structural diagram of a display panel according to an embodiment of the present disclosure.

FIG. 3 is a structural diagram of the display panel according to an embodiment of the present disclosure. As shown in FIG. 3, a display panel 10 includes a display area and a non-display area. The display panel further includes multiple cascaded shift registers disposed in the non-display area and multiple scanning lines 30 disposed in the display area, and each of the multiple shift registers is connected to a respective one of the multiple scanning lines 30. The multiple shift registers include multiple first shift registers 201 and multiple second shift registers 202. The multiple first shift registers 201 are capable of unidirectional scanning and the multiple second shift registers 202 are capable of bidirectional scanning. The display area includes a first display area 101 and a second display area 102. Each of scanning lines 30 in the first display area 101 is connected to a respective one of the multiple first shift registers 201, and each of the at least part of the scanning lines 30 in the second display area 102 is connected to a respective one of the multiple second shift registers 202.

In one or more embodiments, the display panel further includes multiple data cables and multiple sub-pixels. The sub-pixels are connected to corresponding scanning lines and data cables. The multiple scanning lines are arranged in multiple rows, the plurality of data cables are arranged in multiple columns, and the sub-pixels are arranged in an array. For example, a row of sub-pixels are connected to one of the multiple scanning lines, and a column of sub-pixels are connected to one of the multiple data cables. The multiple shift registers output scanning signals row-by-row to the multiple scanning lines which are connected to a respective one of the multiple shift registers. In the process of outputting the scanning signals to a row of the multiple scanning lines, a row of sub-pixels which are connected to the row of the multiple scanning lines are turned on, data signals transmitted on the data cables are written into the row of sub-pixels, and the display of the row of sub-pixels is refreshed. Generally, scanning is performed from a first row of the multiple scanning lines to a last row of the multiple scanning lines or from the last row of the multiple scanning lines to the first row of the multiple scanning lines, that is, a process of row-by-row scanning is completed and display of display pictures is refreshed. The multiple first shift registers 201 perform unidirectional scanning. For example, the multiple shift registers are capable of scanning along an a-b direction. That is, along the a-b direction, the multiple shift registers output the scanning signals to the multiple scanning lines connected to a respective one of the multiple shift registers stage by stage. The first shift registers are capable of unidirectional scanning. A direction of the unidirectional scanning may be from a first of the first shift register 201 to a last of the first shift register 201, which are successively outputting the scanning signals and driving a scanning direction of the scanning line electrically connected to the first shift register. The direction of the unidirectional scanning may also be from the last-stage first shift register 201 to the first-stage first shift register 201, which are successively outputting the scanning signals and driving the scanning direction of the scanning line electrically connected to the first shift register. The second shift registers are capable of bidirectional scanning. The bidirectional scanning means that not only a first-stage second shift registers 202 to a last-stage second shift registers 202 is capable of successively outputting the scanning signals, driving the scanning line electrically connected to the second shift register, but also the last-stage second shift registers 202 to the first-stage second shift registers 202 is capable of successively outputting the scanning signals, driving the scanning line electrically connected to the second shift register.

The second display area 102 may be a special-shaped display area. The special-shaped display area includes areas that possess other functions, such as a fingerprint identification area. Part of the pixel units in the special-shaped display area may adopt the first shift register 201 to perform driving, and the areas that possess other functions may adopt the second shift register 202 to perform driving. In this case, part of the scanning lines 30 in the second display area 102 are connected to the multiple first shift registers 201, and part of the scanning lines 30 are connected to the multiple second shift registers 202. The multiple second shift registers 202 are capable of bidirectional scanning. Through the bidirectional scanning, the special-shaped display area is capable of not only being driven by the first second shift register 202 to the last second shift register 202 sequentially, but also being driven by the last second shift register 202 to the first second shift register 202 sequentially. During display of the second display area 102, the scanning direction of the multiple second shift registers 202 maybe different from the scanning direction of the multiple first shift registers 201, so that only the multiple second shift registers 202 drive a corresponding second display area 102 during display of the second display area 102, thereby reducing the power consumption of the display panel.

Exemplarily, as shown in FIG. 3, the multiple first shift registers are capable of successively outputting the scanning signals along the a-b direction. The multiple second shift registers are capable of not only successively outputting the scanning signals along the a-b direction, but also successively outputting the scanning signals along a b-a direction. The second display area 102 is disposed after the first display area 101, thereby the multiple second shift registers 202 are disposed after the last-stage first shift register 201. When the first display area 101 and the second display area 102 in the display panel both display, the trigger signals are input to a first trigger signal line STV1. The trigger signals generally are pulse signals. The trigger signals trigger the first-stage first shift register to output a scanning signal, the first-stage first shift register triggers a second-stage first shift register to output a scanning signal. In this way, along the a-b direction, the first-stage first shift register through the last-stage shift register output scanning signals stage by stage to the scanning lines connected to the first shift registers. A first sub-display area displays or refreshes displayed content. When the last-stage first shift register 201 outputs a scanning signal, and when the last-stage first shift register 201 outputs a trigger signal to the first-stage second shift register 202, the first-stage second shift register 202 outputs a scanning signal, and then the multiple second shift registers 202 output scanning signals stage by stage, a first sub-display area displays or refreshes displayed content. When the trigger signals are input to a second trigger signal line STV2, the last-stage second shift register outputs a scanning signal, the last-stage second shift register triggers an preceding one of the two adjacent stages of the multiple second shift registers 202 to output a scanning signal. In this way, along the b-a direction, the last-stage second shift register to the first-stage second shift register output scanning signals stage-by-stage to achieve the displaying or the refreshing of the display contents of a second sub-display area. After the first-stage second shift register outputs a scanning signal, because the first shift registers can only perform unidirectional scanning along the a-b direction and not trigger the last-stage first shift register to output the scanning signal, the multiple first shift registers do not output scanning signals, which is capable of achieving the contents only displayed in the second sub-display area. When the contents only displayed in the second sub-display area, only the second shift registers connected to the scanning lines in the second sub-display area work, not all shift registers have to work (not both the first shift registers and the second shift registers have to work), reducing the power consumption. That is, when only the second display area 102 displays, the scanning direction of the display panel is selected from bottom to top (from b to a). In this case, the multiple second shift registers 202 from the last-stage second shift register 202 to the first-stage second shift register 202 successively drives the scanning lines which are electrically connected to a respectively one of the multiple second shift registers 202, the scanning direction of the multiple first shift registers 201 is opposite to the scanning direction of the multiple second shift registers 202, and only the multiple second shift registers 202 drive the second display area where the scanning lines which are connected to the multiple second shift registers are disposed to display, reducing the power consumption. When display areas need to display, a top-down (from a to b) scanning is capable of being selected.

In the technical solution of the embodiment, the first shift registers is capable of performing unidirectional scanning, and the second shift registers is capable of performing bidirectional scanning. When the first display area and the second display area both need to display, the multiple first shift registers is capable of being triggered and controlled to scan along the first direction. After the scanning of the first shift registers is completed, the last-stage first shift register that completes the scanning may trigger the second shift register to output the scanning signal, and the multiple second shift registers scan along the first direction. When only the second shift registers are needed to scan, the display function or other functions of the second display area are completed, for example, the second shift registers drive fingerprint sensing units to perform the fingerprint identification, trigger and control the multiple second shift registers to scan along a second direction. The first direction is opposite to the second direction. In this process, only the second shift registers are working to reduce the power consumption of the display panel.

Figure 4:
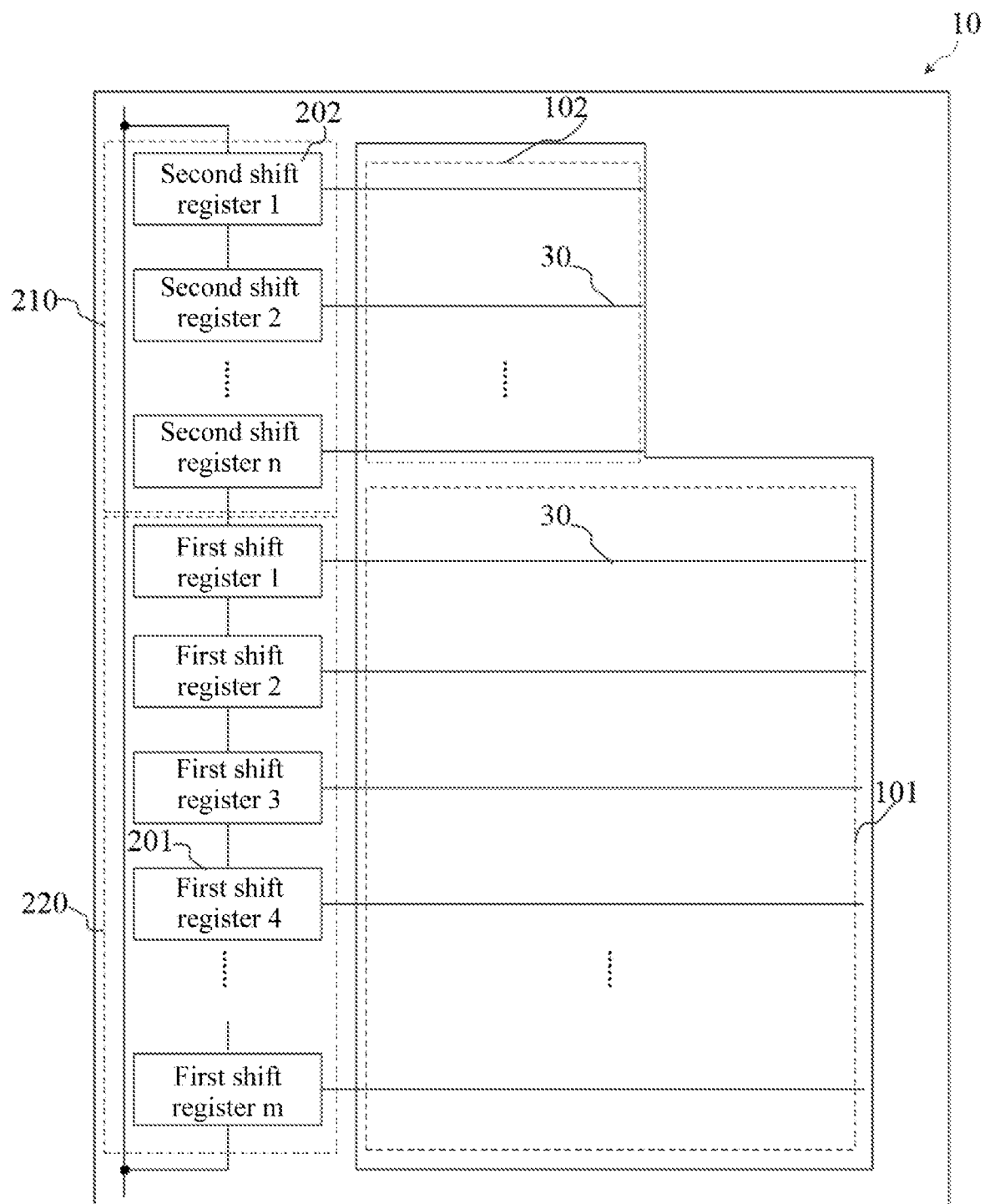
FIG. 4 is a structural diagram of another display panel according to an embodiment of the present disclosure.

The display panel provided in the embodiment of the present disclosure may be a special-shaped display panel. The second sub-display area is a special-shaped area of the special-shaped display panel. Exemplarily, FIG. 4 is a structural diagram of another display panel according to an embodiment of the present disclosure. As shown in FIG. 4, the second display area 102 is disposed upper than the first display area 101 and the multiple second shift registers 202 are disposed upper than the first-stage first shift register 201. There are m stages of the multiple first shift registers 201 and n stages of the multiple second shift registers 202. The m and n are both integers greater than 1, and a first shift register m may mean a mth-stage first shift register. The second display area 102 is the special-shaped display area. When the first display area 101 and the second display area 102 in the display panel both display, the scanning direction of the display panel is selected from bottom to top. In this case, the multiple first shift registers 201 and the multiple second shift registers 202 have a same scanning direction. The multiple first shift registers 201 from the last-stage first shift register 201 to the first-stage first shift register 201 successively output scanning signals to the scanning lines 30 eclectically connected to the multiple first registers 201, after the first-stage first shift register 201 outputs a scanning signal, trigger and drive the last-stage second shift register 202 to output a scanning signal, and then the multiple second shift registers 202 output scanning signals from the last-stage to the first-stage. When only the second display area displays, the scanning direction of the display panel is selected from top to bottom. In this case, the multiple second shift registers 202 from the first-stage second shift registers 202 to the last-stage second shift registers 202 successively outputs scanning signals to the scanning lines 30 in the second display area 102. Because the first shift registers generally perform unidirectional scanning, after the last-stage second shift register (a nth-stage second shift register) outputs the scanning signal, the multiple first shift registers do not work, in this case only the multiple second shift registers 202 drive a corresponding second display area 102 to display, reducing the power consumption of the display panel.

Figure 5:
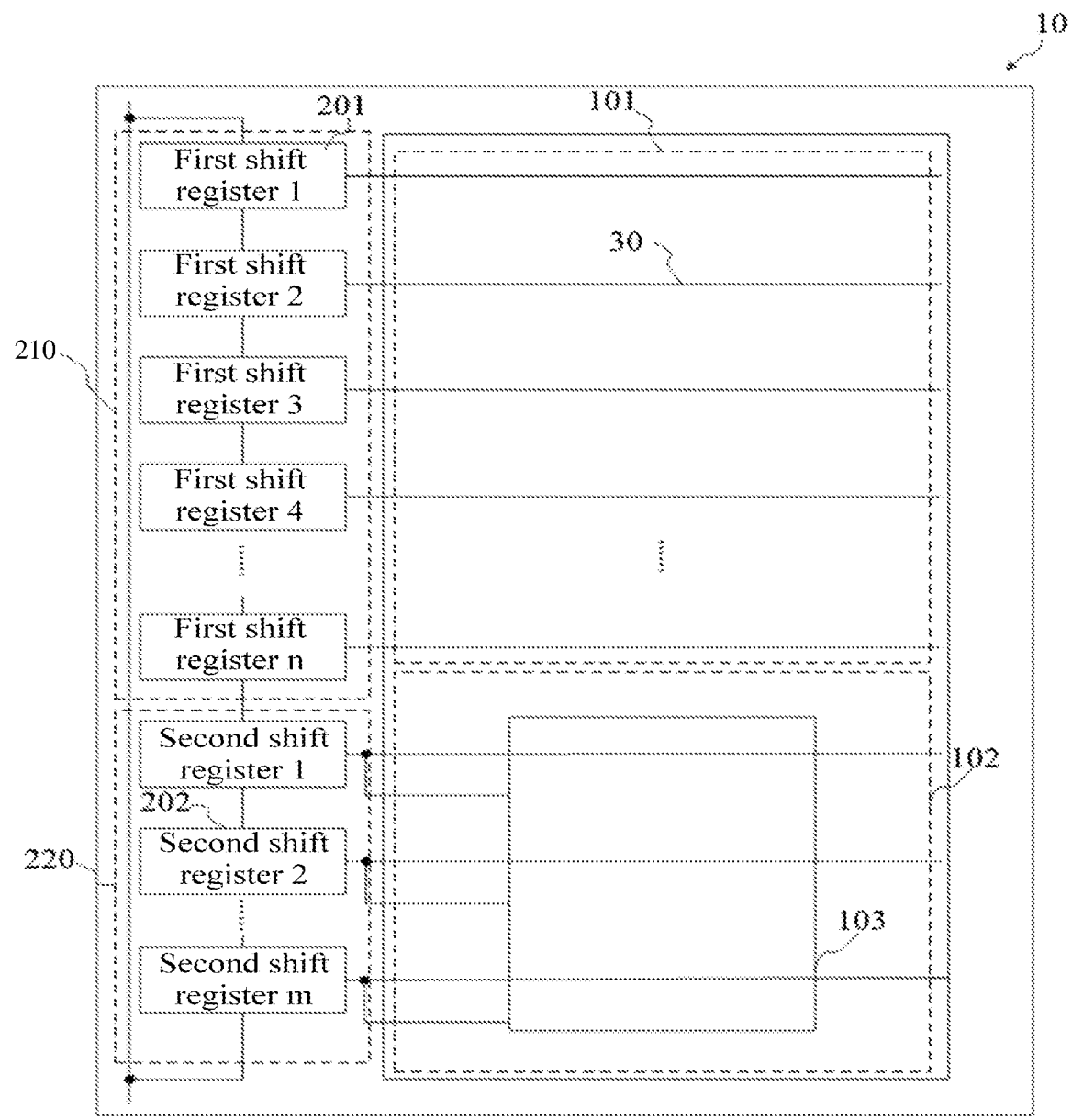
FIG. 5 is a structural diagram of another display panel according to an embodiment of the present disclosure.

On the basis of the above-mentioned technical solutions, FIG. 5 is a structural diagram of another display panel according to an embodiment of the present disclosure. As shown in FIG. 5, the second display area 102 includes a fingerprint identification area 103, and the fingerprint identification area 103 includes multiple fingerprint identification units. The shift registers connected to the at least part of scanning lines 30 in the second display area 102 are further configured to provide control signals to the fingerprint identification units.

Figure 6:
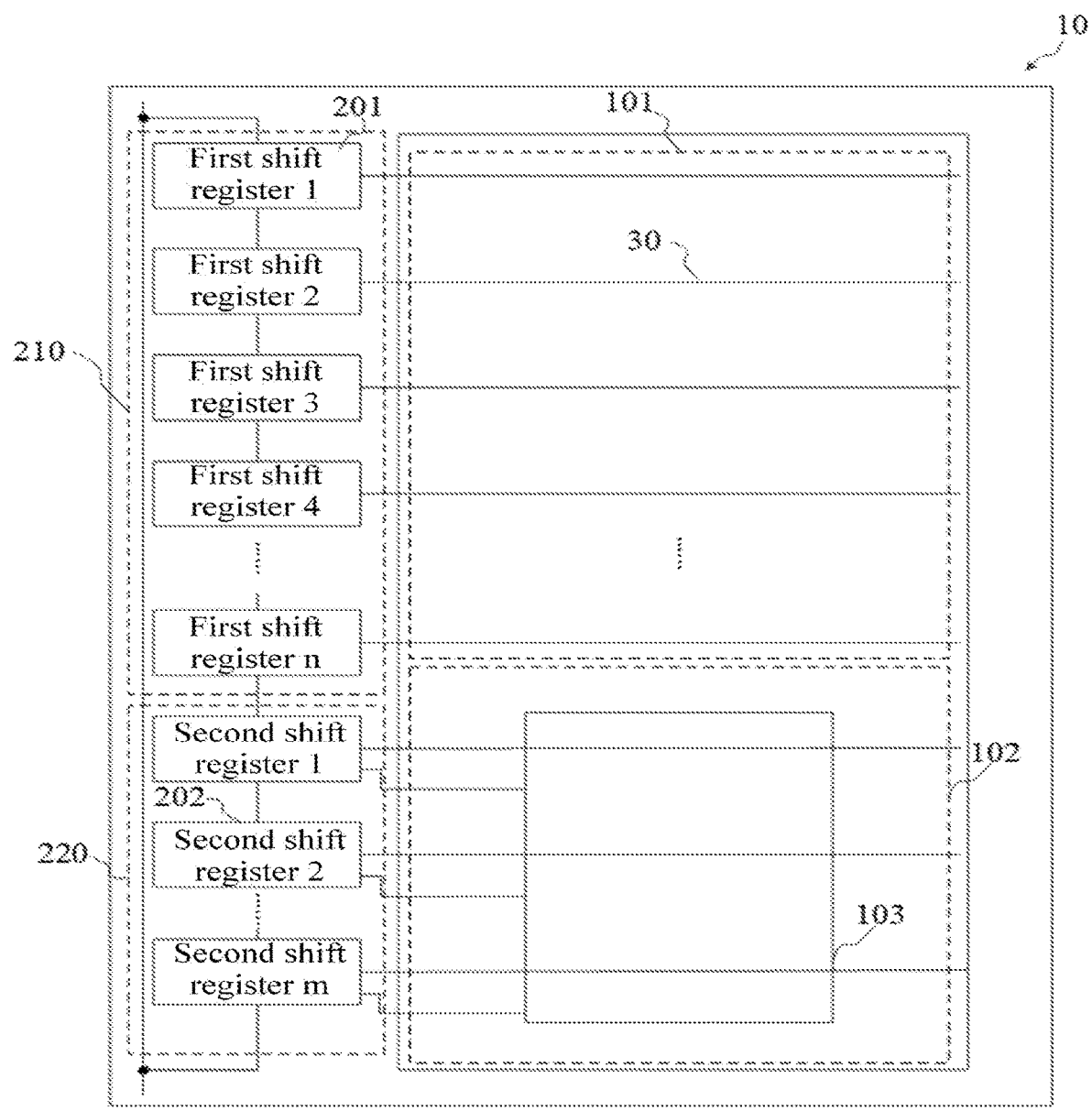
FIG. 6 is a structural diagram of another display panel according to an embodiment of the present disclosure.

In one or more embodiments, the shift registers which are connected to the scanning lines 30 in the second display area 102 may have multiple connection modes. Exemplarily, as shown in FIG. 5, the scanning lines 30 in the first display area 101 are connected to the first shift registers 201, the first shift registers are configured to provide the scanning signals to the scanning lines in the first display area 101. The second shift registers are electrically connected to the scanning lines in the second display area 102, and configured to provide the scanning signals to the scanning lines in the second display area 102. Part of or all the second shift registers are further configured to provide the control signals to the fingerprint identification units and drive the fingerprint identification area 103 to perform the fingerprint identification. FIG. 6 is a structural diagram of another display panel according to an embodiment of the present disclosure. As shown in FIG. 6, the second shift registers connected to the scanning lines 30 in the second display area 102 not only provide the scanning signals for the display area formed by pixel units, but also provide the control signals for the fingerprint identification units. Each of the second shift registers in FIG. 5 includes an output end, the output end provides the scanning signals for scanning, and provides the control signals for the fingerprint identification units in the fingerprint identification area. That is, the scanning signals are further used as the control signals for controlling the fingerprint identification units. Different from the second shift registers in the display panel shown in FIG. 5, each of the second shift registers in FIG. 6 has two output ends, one output end is connected to the scanning line 30, the other output end is connected to a respectively one of the fingerprint identification units in the fingerprint identification area, and configured to drive the fingerprint identification units in the fingerprint identification area to perform the fingerprint identification. This way not only can be used to ensure the fingerprint identification, but also can reduce the influence to the scanning signals on the scanning lines, improving display effects.

It is to be noted that the position of the fingerprint identification area 103 in the second display area 102 is not limited.

On the basis of the above-mentioned technical solutions, first shift registers each of which is connected to a respective one of the plurality of scanning lines 30 in the first display area 101, are disposed on one side of the first display area 101, or on two opposite sides of the first display area 101.

Figure 7:
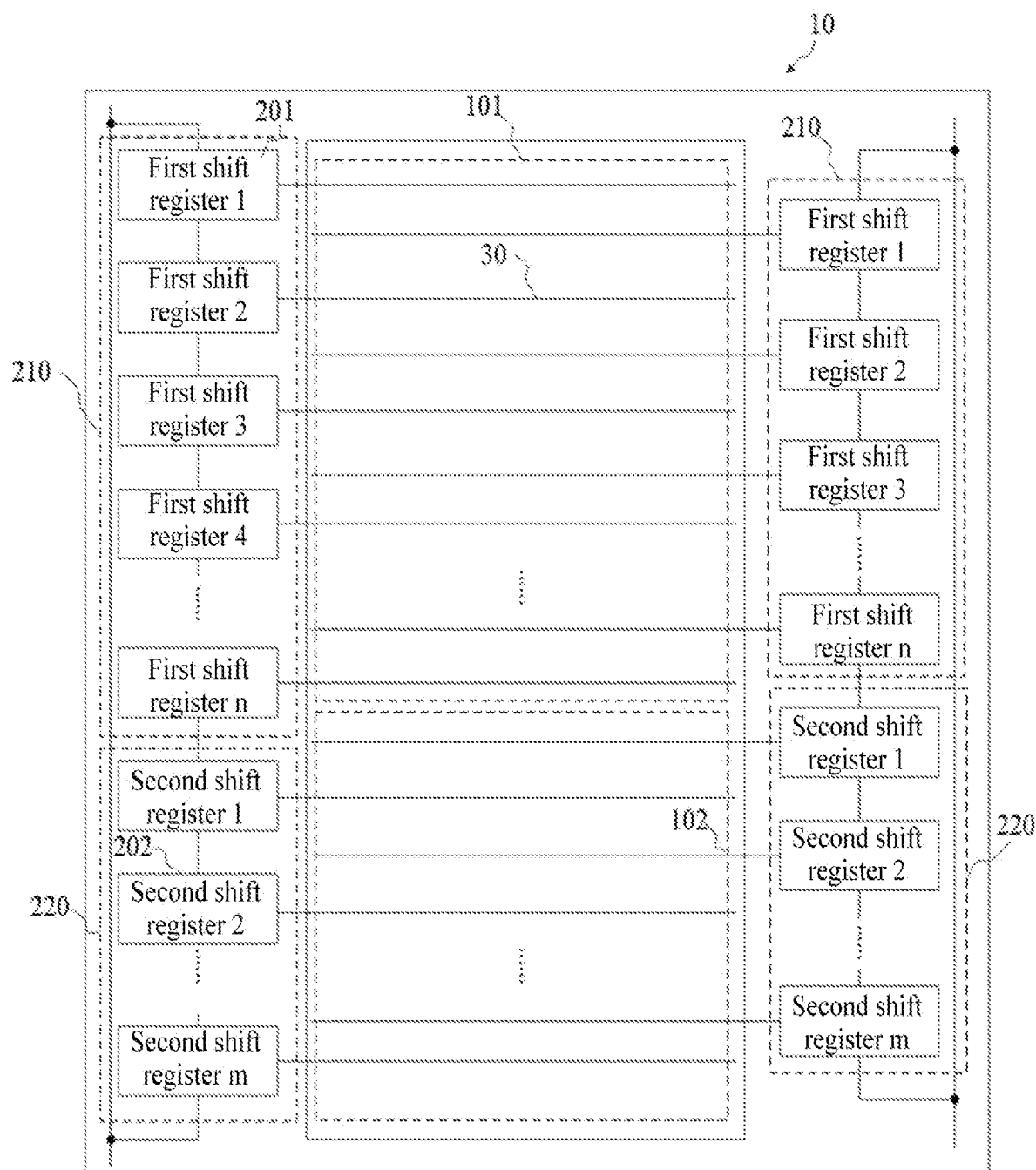
FIG. 7 is a structural diagram of another display panel according to an embodiment of the present disclosure.

In one or more embodiments, when the shift registers connected to the at least part of scanning lines 30 in the first display area 101 are disposed on one side of the first display area 101. As shown in FIG. 3 to FIG. 6, the multiple shift registers are connected to the at least part of scanning lines in the first display area 101 row-by-row, and driving the first display area 101 to display row-by-row. FIG. 7 is a structural diagram of another display panel according to an embodiment of the present disclosure. As shown in FIG. 7, the multiple shift registers connected to the at least part of scanning lines 30 in the first display area 101 are disposed on two opposite sides of the first display area 101. The first shift registers 201 on the two sides alternately drive the scanning lines 30 in the first display area 101. Exemplarily, the first shift registers 201 on the one side of the first display area 101 are configured to provide scanning signals for odd-numbered rows of scanning lines 30, and the first shift registers 201 on the other side of the first display area 101 are configured to provide scanning signals for the even-numbered rows of scanning lines 30. Alternatively, the first shift registers 201 on the one side of the first display area 101 are configured to provide the scanning signals for the even-numbered rows scanning lines 30, and the first shift registers 201 on the other side of the first display area 101 are configured to provide the scanning signals for the odd-numbered rows of scanning lines 30.

On the basis of the above-mentioned technical solutions, referring to FIG. 7, the multiple shift registers connected to the at least part of scanning lines 30 in the second display area 102 are the second shift registers 202, and are disposed on one side or two opposite sides of the second display area 102.

In one or more embodiments, when the multiple shift registers connected to the at least part of scanning lines 30 in the second display area 102 are all second shift registers 202, the power consumption of the display panel can be reduced when the second shift registers 202 drive display of the second display area 102. The second shift registers 202 may be disposed on the one side of the second display area 102. As shown in FIG. 3 to FIG. 6, the second shift registers 202 are connected to the scanning lines in the second display area 102 row-by-row, and driving the second display area 102 to display row-by-row. The second shift registers 202 may be disposed on the two opposite sides of the second display area 102. As shown in FIG. 7, the second shift registers 202 on the two sides alternately drive the scanning lines 30 in the second display area 102. Exemplarily, the second shift registers 202 on the one side of the second display area 102 are configured to provide the scanning signals or the control signals for the odd-numbered rows scanning lines in the second display area 102, and the second shift registers 202 on the other side of the second display area 102 are configured to provide the scanning signals or the control signals for even-numbered rows of scanning lines. Alternatively, the second shift registers 202 on the one side of the second display area 102 are configured to provide the scanning signals and/or the control signals for the even-numbered rows of scanning lines, and the second shift registers 202 on the other side of the second display area 102 are configured to provide the scanning signals and/or the control signals for the odd-numbered rows of scanning lines. The control signals are capable of being configured to drive fingerprint identification units.

On the basis of the above-mentioned technical solutions, referring to FIG. 5 to FIG. 7, the multiple first shift registers 201 constitute at least one first shift register group 210, and the first shift registers 201 in each of the at least one first shift register group 210 are cascaded. The multiple second shift registers 202 constitute at least one second shift register group 220, and second shift registers 202 in each of the at least one second shift register group 220 are cascaded.

On a same side of the display area, a first-stage first shift register 201 in one of the at least one first shift register group 210 and a last-stage second shift register 202 in one of the at least one second shift register group 220 are cascaded, or a last-stage first shift register 201 in the one of the at least one first shift register group 210 and a first-stage second shift register 202 in the one of the at least one second shift register group 220 are cascaded.

In one or more embodiments, as shown in FIG. 5 to FIG. 7, when the multiple first shift registers 201 are all disposed on the one side of the display area, the multiple first shift registers 201 constitute one first shift register group 210, and first shift registers 201 in the first shift register group 201 are cascaded. When the multiple first shift registers 201 are disposed on the two opposite sides of the display area, the multiple first shift registers 201 may constitute two first shift register groups 210. The first shift registers 201 on the one side of the display area is one first shift register group 210, the first shift registers 201 on the other side of the display area is the other first shift register group 210. And first shift registers in each of the two first shift register groups are cascaded. Similarly, when the multiple second shift registers 202 are all disposed on the one side of the display area, the multiple second shift registers 202 constitute one second shift register group 220, and second shift registers 202 in the second shift register group 220 are cascaded. When the multiple second shift registers 202 are disposed on the two opposite sides of the display area, the multiple second shift registers 202 may constitute two second shift register groups 220, and second shift registers 202 in each of the two second shift register groups 220 are cascaded.

Figure 8:
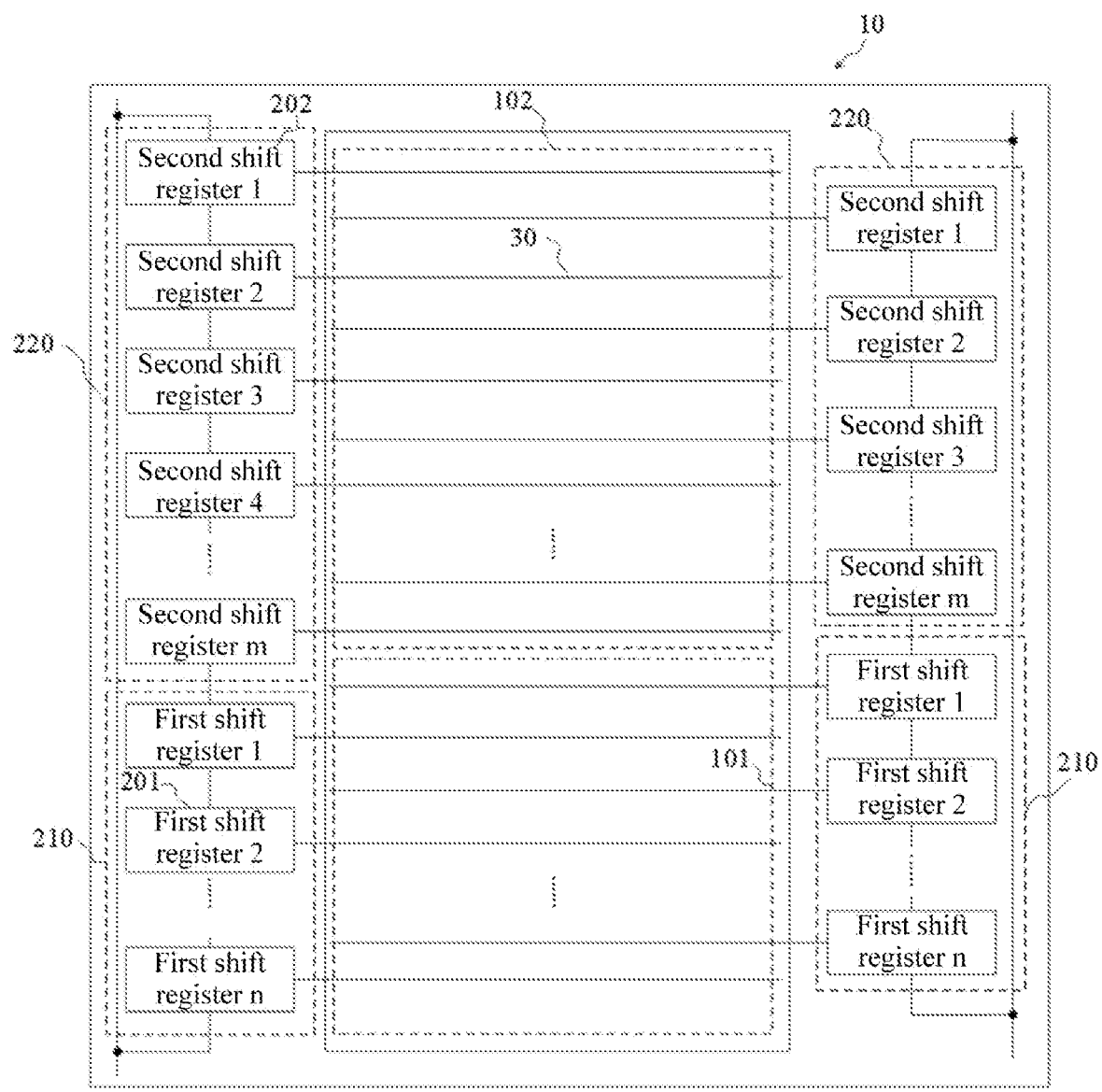
FIG. 8 is a structural diagram of another display panel according to an embodiment of the present disclosure.

Additionally, the at least one first shift register group 210 and the at least one second shift register group 220 on the one side of the display area are cascaded. Exemplarily, as shown in FIG. 7, when the multiple second shift registers 202 are disposed lower than the last-stage first shift register 201, the last-stage first shift register 201 in the at least one first shift register group 210 is connected to the first-stage second shift register 202 in the at least one second shift register group 220 on the one side of the display area. FIG. 8 is a structural diagram of another display panel according to an embodiment of the present disclosure. As shown in FIG. 8, when the multiple second shift registers 202 are disposed upper than the first-stage first shift register 201, the first-stage first shift register 201 of the first shift register group 210 and the last-stage second shift register 202 of the second shift register group 220 on the one side of the display area are connected.

In the above-mentioned technical solution, the multiple first shift registers constitute at least one first shift register group, and first shift registers in each of the at least one first shift register group are cascaded. The multiple second shift registers constitute at least one second shift register group, and second shift registers in each of the at least one second shift register group are cascaded. On the same side of the display area, the first-stage first shift register of the at least one first shift register group and the last-stage second shift register of the at least one second shift register group are cascaded, or the last-stage first shift register of the at least one first shift register group and the first-stage the second shift register of the at least one second shift register group are cascaded, which can achieve that the multiple first shift registers and the multiple second shift registers are cascaded.

Figure 9:
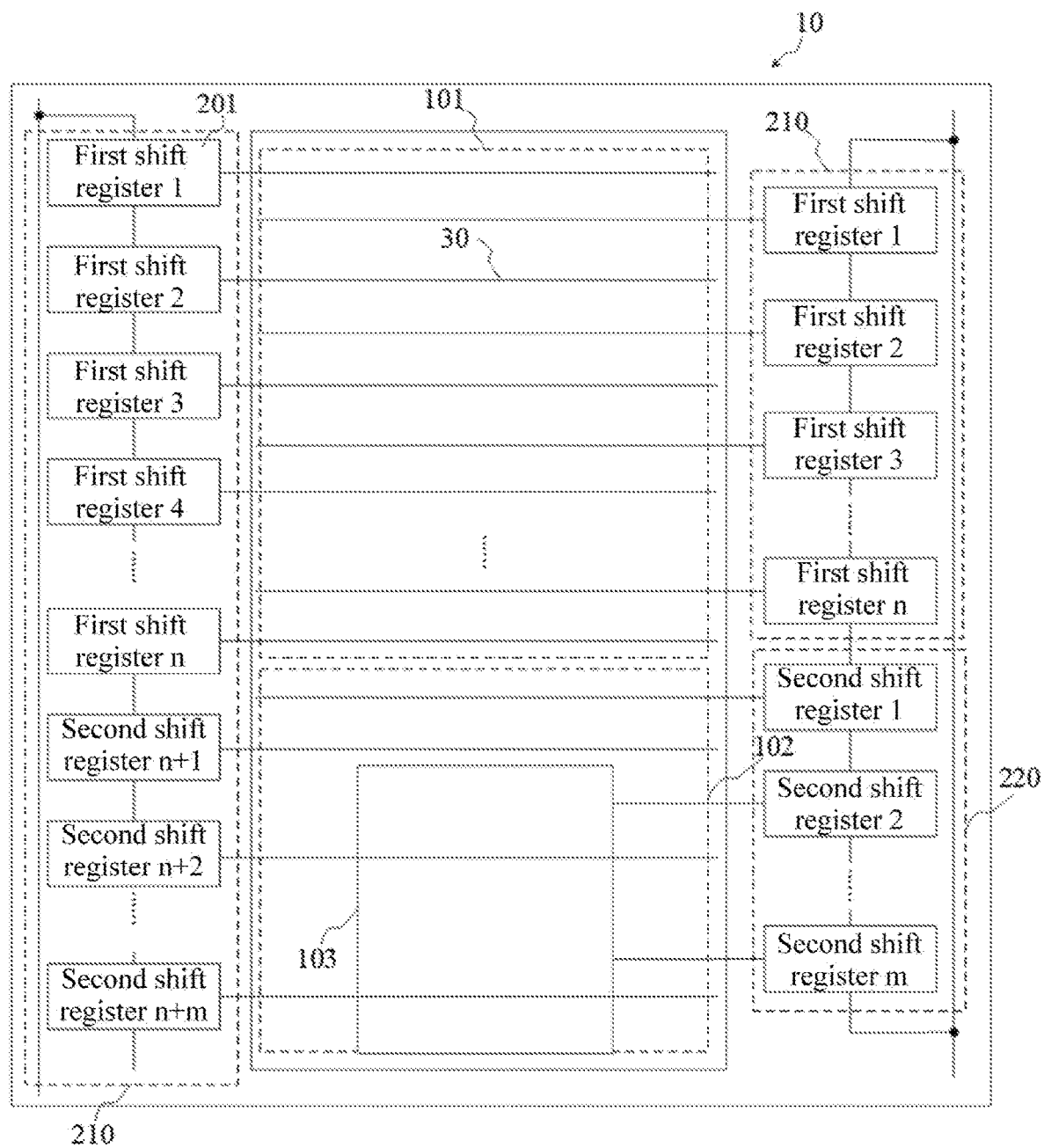
FIG. 9 is a structural diagram of another display panel according to an embodiment of the present disclosure.

On the basis of the above-mentioned technical solutions, FIG. 9 is a structural diagram of another display panel according to an embodiment of the present disclosure. As shown in FIG. 9, the at least one first shift register group 210 includes two first shift register groups, respectively disposed on a first side of the display area and a second side of the display area. In one or more embodiments, the at least one first shift register group 210 on the first side and the at least one first shift register group 210 on the second side alternately drive the first display area 101. The second shift registers 202 in the at least one second shift register group 220 drive the second display area 102 connected to the second shift registers 202. Exemplarily, as shown in FIG. 9, the second shift registers 202 in the at least one second shift register group is connected to the fingerprint identification area 103. Therefore, the second shift registers 202 drive the fingerprint identification area 103 in the second display area 102.

Figure 10:
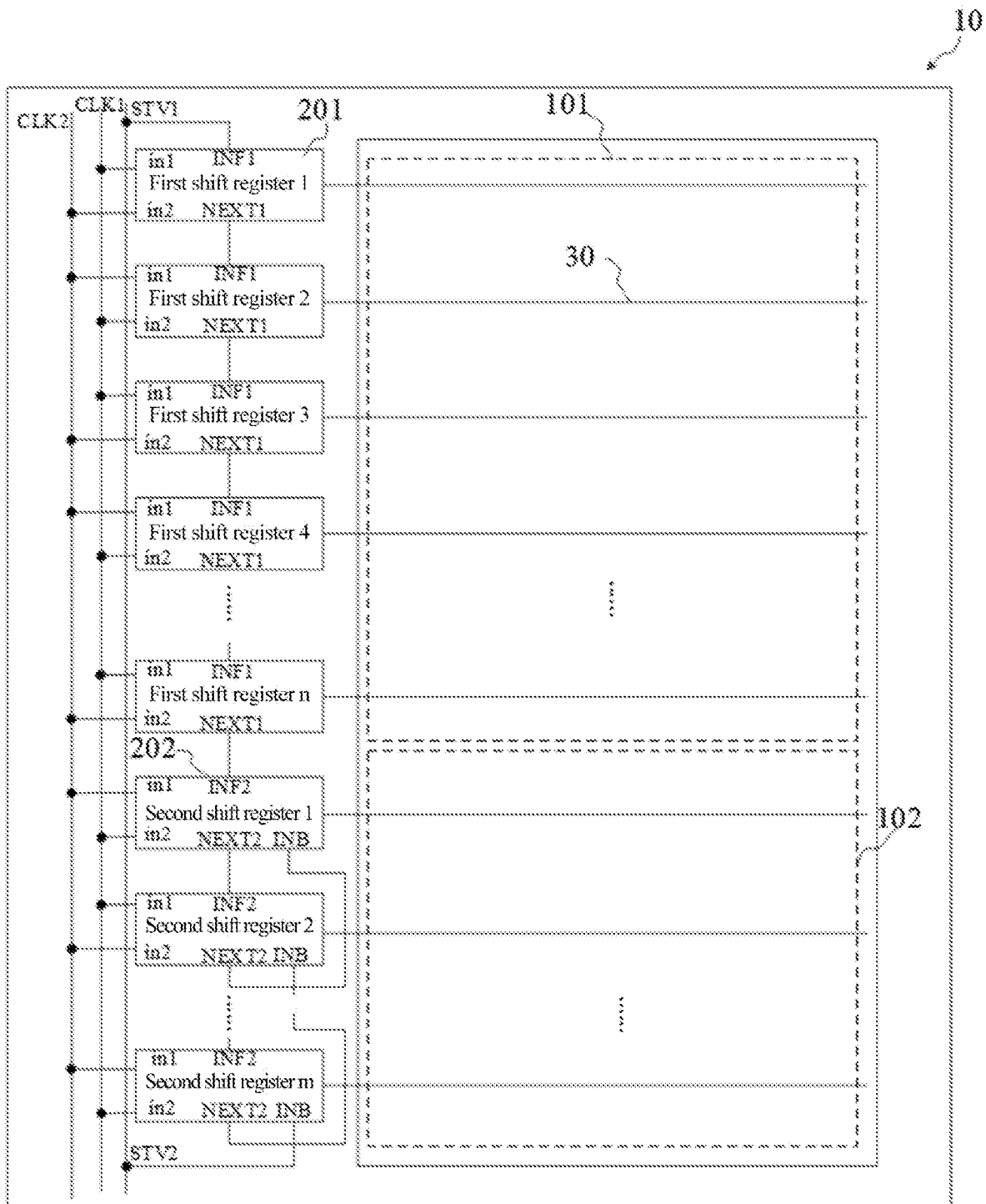
FIG. 10 is a structural diagram of another display panel according to an embodiment of the present disclosure.

FIG. 10 is a structural diagram of another display panel according to an embodiment of the present disclosure. As shown in FIG. 10, each of the multiple first shift registers 201 includes a first trigger signal input end INF1 and a first trigger signal output end NEXT1, each of the multiple second shift registers 202 includes a second trigger signal input end INF2, a third trigger signal input end INB and a second trigger signal output end NEXT2. In two adjacent stages of the multiple first shift registers, the first trigger signal input end INF1 of a succeeding one of the two adjacent stages of the multiple first shift registers 201 is connected to the first trigger signal output end NEXT1 of a preceding one of the two adjacent stages of the multiple first shift registers. In two adjacent stages of the multiple second shift registers 202, the second trigger signal input end INF2 of a succeeding one of the two adjacent stages of the multiple second shift registers 202 is connected to the second trigger signal output end NEXT2 of a preceding one of the two adjacent stages of the multiple second shift registers 202, and the second trigger signal output end NEXT2 of the succeeding one of the two adjacent stages of the multiple second shift registers 202 is connected to the third trigger signal input end INB of a preceding one of the two adjacent stages of the multiple second shift registers.

The display panel further includes a first start signal line STV1 and a second start signal line STV2. On the same side of the display area, the first trigger signal input end INF1 of a first-stage first shift register 201 is connected to the first start signal line STV1, the second trigger signal input end INF2 of a first-stage second shift register 202 is connected to the first trigger signal output end NEXT1 of a last-stage first shift register 201, the third trigger signal input end INB of a last-stage second shift register 202 is connected to the second start signal line STV2.

In one or more embodiments, as shown in FIG. 10, in two adjacent stages of multiple stages of first shift registers 201, the first trigger signal input end INF1 of the succeeding one of the two adjacent stages of the multiple first shift registers 201 is connected to the first trigger signal output end NEXT1 of the preceding one of the two adjacent stages of the multiple first shift registers 201 to achieve unidirectional cascade of the multiple stages of first shift registers 201. Therefore, the first shift registers 201 perform unidirectional scanning. Exemplarily, the first trigger signal input end INF1 of a first shift register 2 is connected to the first trigger signal output end NEXT1 of a first shift register 1. Therefore after the first shift register 1 is driven, the first trigger signal output end NEXT1 of the first shift register 1 outputs a first trigger signal, the first shift register 2 is driven, that is, outputting a scanning signal according to the first trigger signal output by the first trigger signal output end NEXT1. In this way, it achieves that the scanning direction of the multiple stages of the first shift registers 201 is the scanning direction from the first shift register 1 to a first shift register n. In two adjacent stages of multiple stages of the second shift registers 202, the second trigger signal input end INF2 of a succeeding one of the two adjacent stages of the multiple second shift registers 202 is connected to the second trigger signal output end NEXT2 of a preceding one of the two adjacent stages of the multiple second shift registers 202. The scanning direction of the multiple stages of the second shift registers 202 is achieved from a second shift register 1 to a second shift register m. The second trigger signal output end NEXT2 of a succeeding one of the two adjacent stages of the multiple second shift registers 202 is connected to the third trigger signal input end INB of a preceding one of the two adjacent stages of the multiple second shift registers 202. The scanning direction of the multiple stages of the second shift registers 202 is achieved from the second shift register m to the second shift register 1. Exemplarily, the second trigger signal input end INF2 of a second shift register 2 is connected to the second trigger signal output end NEXT2 of the second shift register 1. Therefore, the second shift register 2 is driven via the second trigger signal input end INF2 only when the second shift register 1 is driven via the second trigger signal input end INF2 and the second trigger signal output end NEXT2 outputs a second trigger signal. In this way, the scanning direction of the multiple stages of the second shift registers 202 is achieved from the second shift register 1 to the second shift register m. The second trigger signal output end NEXT2 of a second shift register 3 is connected to the third trigger signal input end INB of the second shift register 2. Therefore, the second shift register 2 is driven via the third trigger signal input end INB only when the second shift register 3 is driven via the third trigger signal input end INB and the second trigger signal output end NEXT2 outputs a third trigger signal. In this way, the scanning direction of the multiple stages of the second shift registers 2 is achieved from the second shift register m to the second shift register 1.

When the first display area 101 and the second display area 102 of the display panel both display, the first start signal line STV1 outputs a valid first trigger signal and the second start signal line STV2 outputs an invalid second trigger signal. In this case, the scanning direction of the display panel is from top to bottom. The first start signal drives the first-stage first shift register 201, the scanning direction of cascaded shift registers is from the first-stage first shift register 201 to the last-stage second shift register 202. When the first display area 101 of the display panel displays, the first start signal line STV1 outputs a valid the first trigger signal and the second start signal line STV2 outputs an invalid second trigger signal. In this case, the scanning direction of the display panel is from top to bottom. The first start signal drives the first-stage first shift register 201, the scanning direction of cascaded the first shift registers is from the first-stage first shift register 201 to the last-level the first shift register 201. When the second display area 102 of the display panel displays, the first start signal line STV1 outputs an invalid first trigger signal and the second start signal line STV2 outputs a valid second trigger signal. In this case, the scanning direction of the display panel is from bottom to top. The second start signal drives the last-stage second shift register 202 and the scanning direction of cascaded second shift registers 202 is from the last-stage second shift register 202 to the first-stage second shift register 202, which achieves that only the second shift registers 202 corresponding to the second display area 102 are triggered to driven when the second display area 102 displays, thereby reducing the power consumption.

In general, the first trigger signal and the second trigger signal in valid state are mutually inverted signals. Exemplarily, when the first trigger signal in valid state is a high-stage signal, the second trigger signal in valid state is a low-stage signal, or when the first trigger signal in valid state is a low-stage signal, the second trigger signal in valid state is a high-stage signal.

It is to be noted that, as shown in FIG. 10, the first start signal line STV1 and the second start signal line STV2 may be a same signal line, and may achieve a control of the scanning direction of the cascaded shift registers via controlling a level value of the same signal line.

Figure 11:
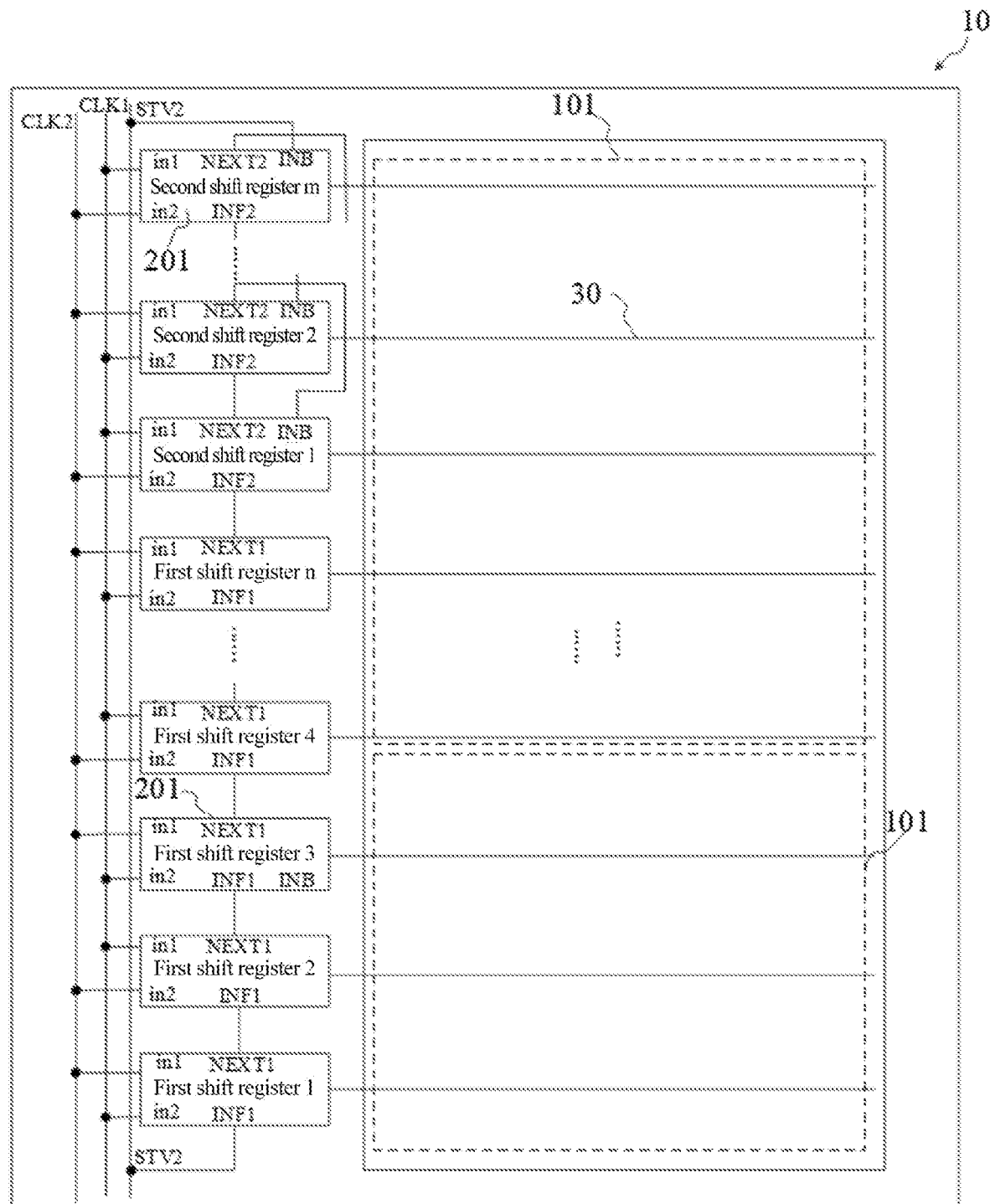
FIG. 11 is a structural diagram of another display panel according to an embodiment of the present disclosure.

FIG. 11 is a structural diagram of another display panel according to an embodiment of the present disclosure. As shown in FIG. 11, in this case, the second display area 102 is disposed upper than the first display area 101, the multiple second shift registers 202 are disposed upper than the multiple first shift registers 201. Connection relation in FIG. 11 is the same as the connection relation in FIG. 10. When the first display area 101 and the second display area 102 of the display panel both display, in this case, the scanning direction of the display panel is from bottom to top. The scanning direction of multiple stages of the shift registers is the same as the scanning direction in FIG. 10. When the first display area 101 of the display panel displays, the scanning direction of the display panel is from bottom to top. When the second display area 102 of the display panel displays, the scanning direction of the display panel is from top to bottom.

Figure 12:
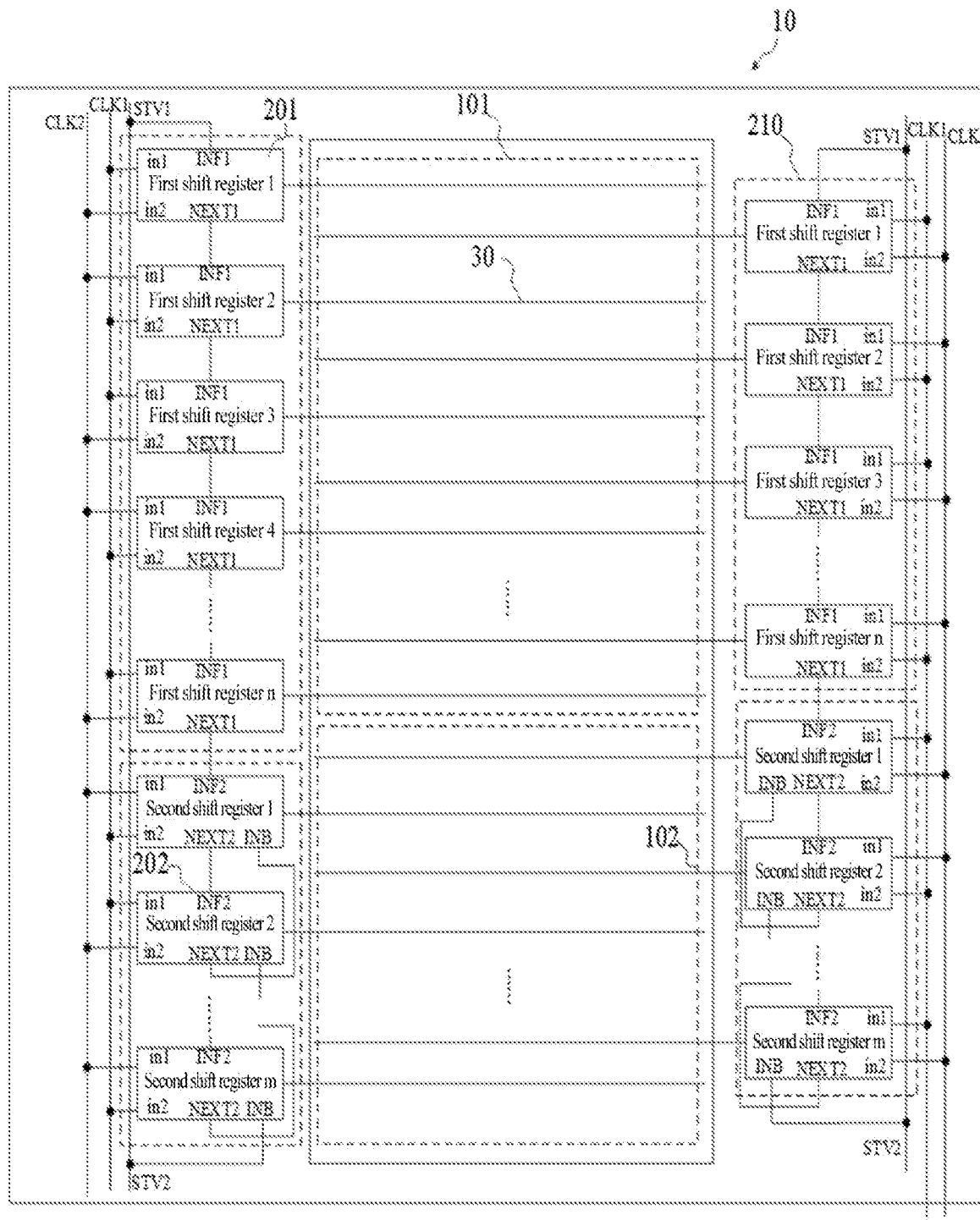
FIG. 12 is a structural diagram of another display panel according to an embodiment of the present disclosure.

FIG. 12 is a structural diagram of another display panel according to an embodiment of the present disclosure. As shown in FIG. 12, two sides of the display area respectively include multiple second shift registers 202 and multiple first shift registers 201. Connection relation of the multiple stages of the shift registers on each side of the display area is the same as the connection relation of the shift registers in FIG. 10. When the multiple second shift registers 202 are disposed lower than the multiple first shift registers 201, the scanning direction of the multiple stages of the shift registers on each side of the display area is the same as the scanning direction of the shift registers in FIG. 10. When the multiple second shift registers 202 are disposed upper than the multiple first shift registers 201, the scanning direction of the multiple stages of the shift registers on each side of the display area is the same as the scanning direction of the shift registers in FIG. 11.

Figure 13:
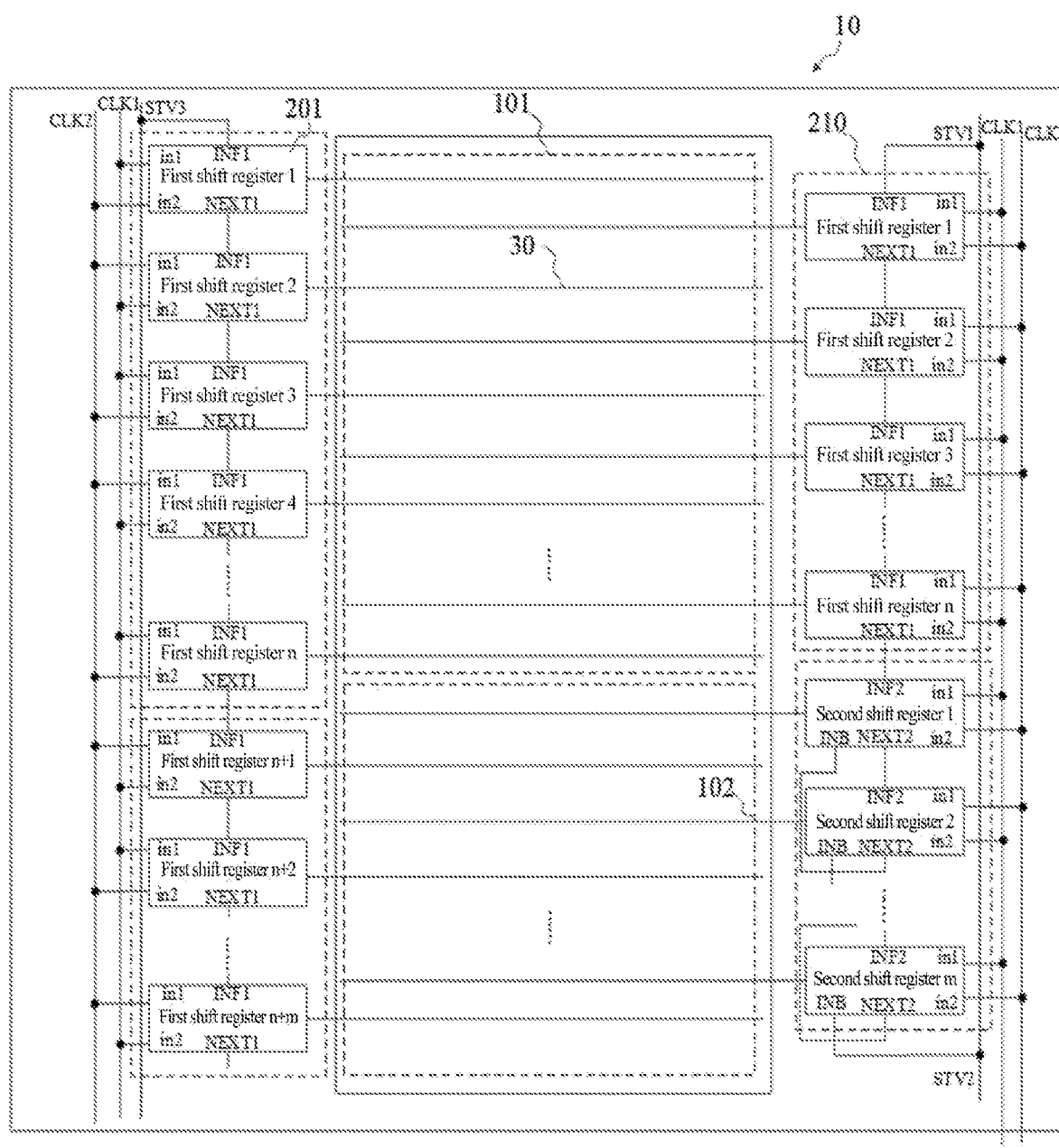
FIG. 13 is a structural diagram of another display panel according to an embodiment of the present disclosure.

FIG. 13 is a structural diagram of another display panel according to an embodiment of the present disclosure. As shown in FIG. 13, the two sides of the display area both include multiple first shift registers 201, a second side of the display area includes multiple second shift registers 202. In this case, the display panel further includes a third start signal line STV3. The third start signal line STV3 is disposed on a first side of the display area, the first start signal line STV1 and the second start signal line STV2 are disposed on the second side of the display area. On the first side of the display area, the first trigger signal input end INF1 of the first-stage first shift register 201 is connected to the third start signal line STV3.

In one or more embodiments, as shown in FIG. 13, the second side of the display area includes multiple stages of first shift registers 201 and multiple stages of second shift registers 202, and further includes the first start signal line STV1 and the second start signal line STV2. Therefore, connection relation of the multiple stages of the shift registers on the second side of the display area is the same as the connection relation in FIG. 10 to FIG. 12. The first side of the display area only includes the multiple stages of the first shift registers 201, the connection relation of the multiple stages of the first shift registers 201 also is cascade, that is, in two adjacent stages of the first shift registers 201, the first trigger signal input end INF1 of a succeeding one of the two adjacent stages of the multiple first shift registers 201 is connected to the first trigger signal output end NEXT1 of a preceding one of the two adjacent stages of the multiple first shift registers. The first trigger signal input end INF1 of the first-stage first shift register 201 is connected to the third start signal line STV3 to achieve a start of the multiple stages of the first shift registers 201.

On the basis of the above-mentioned technical solutions, referring to FIG. 10 to FIG. 13, the display panel further includes a first clock signal line CLK1 and a second clock signal line CLK2. The each of the multiple shift registers further includes a first clock signal input end in1 and a second clock signal input end in2, and first clock signal input ends in1 and second clock signal input ends in2 of two adjacent stages of the multiple shift registers are electrically connected in alternation to the first clock signal line CLK1 and the second clock signal line CLK2.

In one or more embodiments, the multiple stages of shift registers on one side of the display area include (n+m) stages. The first clock signal input ends in1 of the odd-numbered stages of shift registers are connected to the first clock signal line CLK1, and the second clock signal input ends in2 of the even-numbered stages of shift registers are connected to the second clock signal line CLK2, as shown in FIG. 10 to FIG. 13. Alternatively, the first clock signal input ends in1 of the even-numbered stages shift registers are connected to the first clock signal line CLK1, and the second clock signal input end in2 of the odd-numbered stages shift registers are connected to the second clock signal line CLK2. In two adjacent stages of the shift registers, the first clock signal input end in1 and the second clock signal input end in2 are electrically connected in alternation to the first clock signal line CLK1 and the second clock signal line CLK2.

Figure 14:
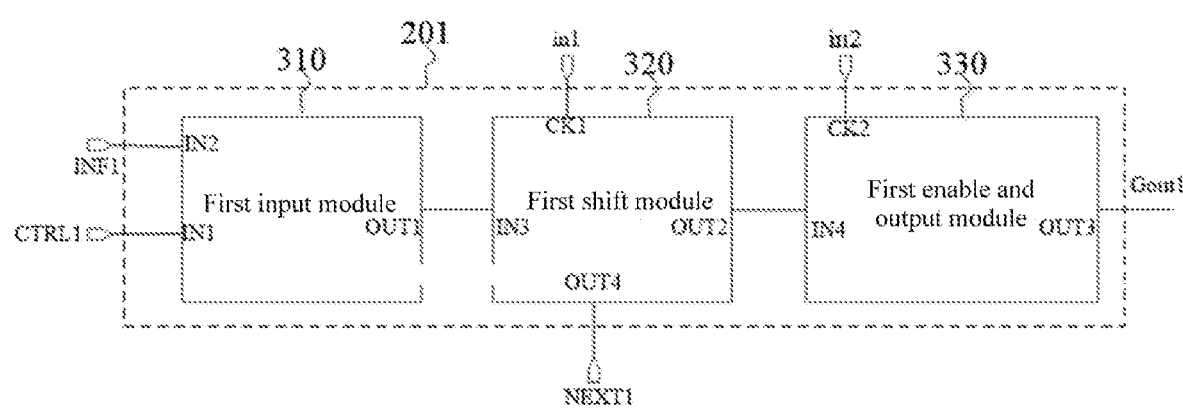
FIG. 14 is a structural diagram of a first shift register according to an embodiment of the present disclosure.

On the basis of the above-mentioned technical solutions, the display panel further includes a first control signal line and a second control signal line. FIG. 14 is a structural diagram of a first shift register according to an embodiment of the present disclosure. As shown in FIG. 14, each of the multiple first registers 201 includes a first input module 310, a first shift module 320 and a first enable and output module 330. The first input module 310 includes a first input end IN1 and a second input end IN2. The first input end IN1 of the first input module 310 is connected to the first control signal line CTRL1, and the second input end IN2 of the first input module severs as the first trigger signal input end INF1 of the respective one of the multiple first registers 201, and the first input module 310 is configured to output a shift control signal. The first shift module 320 includes a first clock signal input end CK1, a first input end IN3 and an output end OUT2. The input end IN3 of the first shift module 320 is connected to an output end OUT1 of the first input module 310. The first clock signal input end CK1 of the first shift module 320 serves as the first clock signal input end in1 of the respective one of the plurality of first registers 201. The first shift module 320 is configured to output a shift signal according to the shift control signal input by the first input end IN3 of the first shift module and a clock signal input by the first clock signal input end CK1 of the first shift module. The first enable and output module 330 includes a second clock signal input end CK2, an input end IN4 and an output end OUT3. The second clock signal input end CK2 of the first enable and output module 330 serves as the second clock signal input end in2 of the respective one of the multiple first shift registers 201. The input end IN4 of the first enable and output module 330 is connected to the output end OUT2 of the first shift module 320. The output end OUT3 of the first enable and output module 330 serves as an output end Gout1 of the respective one of the multiple first registers 201. The first enable and output module 330 is configured to output a scanning signal according to the shift signal input by the input end IN4 of the first enable and output module 330 and the clock signal input by the second clock signal input end CK2 of the first enable and output module 330.

When the first input end IN1 of the first input module 310 and the second input end IN2 of the first input module 310 input the trigger signal, the first input module is configured to output the shift control signal, the output end OUT2 of the first shift module 320 outputs the shift signal. Simultaneously, the first shift module 320 further includes a second output end OUT4 which outputs a secondary trigger signal as a first secondary trigger signal output end NEXT1 of the first shift register 201. The first enable and output module 330 receives the shift signal, and outputs the scanning signal according to the clock signal input by the second clock signal input end CK2.

Figure 15:
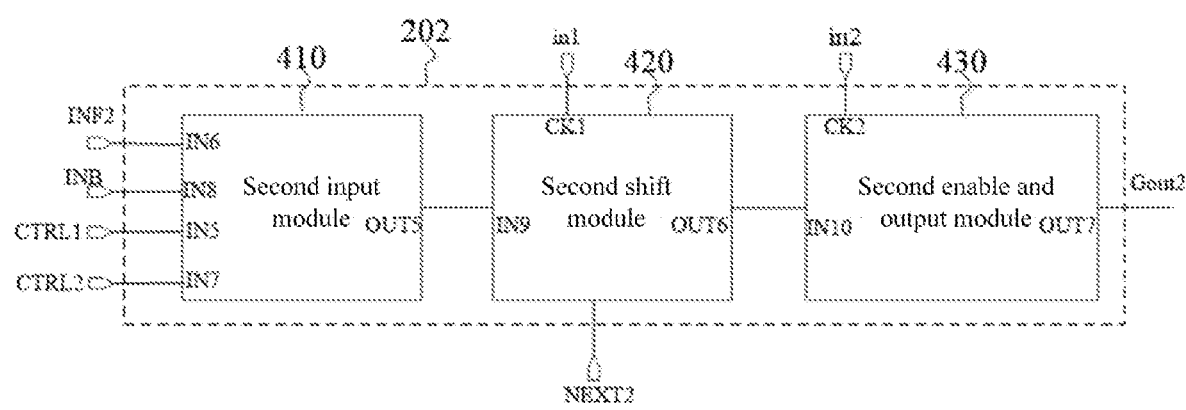
FIG. 15 is a structural diagram of a second shift register according to an embodiment of the present disclosure.

On the basis of the above-mentioned technical solutions, FIG. 15 is a structural diagram of a second shift register according to an embodiment of the present disclosure. As shown in FIG. 15, each of the multiple second shift registers 202 includes a second input module 410, a second shift module 420 and a second enable and output module 430. The second input module 410 includes a first input end IN5, a second input end IN6, a third input end IN7, a fourth input end IN8 and an output end OUT5. The first input end IN5 of the second input module 410 is connected to the first control signal line CTRL1. The second input end IN6 of the second input module 410 serves as the second trigger signal input end INF2 of the respective one of the multiple second shift registers 202. The third input end IN7 of the second input module 410 is connected to the second control signal line CTRL2. The fourth input end IN8 of the second input module 410 serves as the third trigger signal input end INB of the respective one of the multiple second shift registers 202. The output end OUT5 of the second input module 410 is configured to output a shift control signal. The second shift module 420 includes a first clock signal input end CK1, a first input end IN9 and an output end OUT6. The input end IN9 of the second shift module 420 is connected to the output end OUT5 of the second input module 410, the first clock signal input end CK1 of the second shift module 420 serves as the first clock signal input end in1 of the second shift register 202. The second shift module 420 is configured to output a shift signal according to the shift control signal input by the first input end IN9 of the second shift module and a clock signal input by the first clock signal input end CK1 of the second shift module. The second enable and output module 430 includes a second clock signal input end CK2, an input end IN10 and an output end OUT7. The second clock signal input end CK2 of the second enable and output module 430 serves as the second clock signal input end in2 of the respective one of the second shift registers 202. The input end IN10 of the second enable and output module 430 is connected to the output end OUT6 of the second shift module 420. The output end OUT7 of the second enable and output module 430 serves as an output end Gout2 of the respective one of the multiple second registers 202. The second enable and output module 430 is configured to output a scanning signal according to the shift signal input by the input end IN10 of the second enable and output module 430 and the clock signal input by the second clock signal input end CK2 of the second enable and output module 430.

In one or more embodiments, referring to FIG. 13 and FIG. 15, when the trigger signal is input through the first input end IN5 of the second input module 410 and the second input end IN6 of the second input module 410, the scanning direction of the multiple stages of second shift registers 202 is from the preceding one of the two adjacent stages of the multiple second shift registers 202 to the succeeding one of the two adjacent stages of the multiple second shift registers 202. When the trigger signal is input through the third input end IN7 of the second input module 410 and the fourth input end IN8 of the second input module 410, the scanning direction of the multiple stages of second shift registers 202 is from the succeeding one of the two adjacent stages of the multiple second shift registers 202 to the preceding one of the two adjacent stages of the multiple second shift registers 202. Therefore, the scanning direction of the multiple second shift registers 202 is capable of being controlled via controlling the signals input by the first input end IN5, the second input end IN6, the third input end IN7 and the fourth input end IN8 of the second input module 410. After the second input module 410 outputs the shift control signal, a working process of the second shift module 420 and the second enable and output module 430 is similar to the first shift module 320 and the first enable and output module 330.

Figure 16:
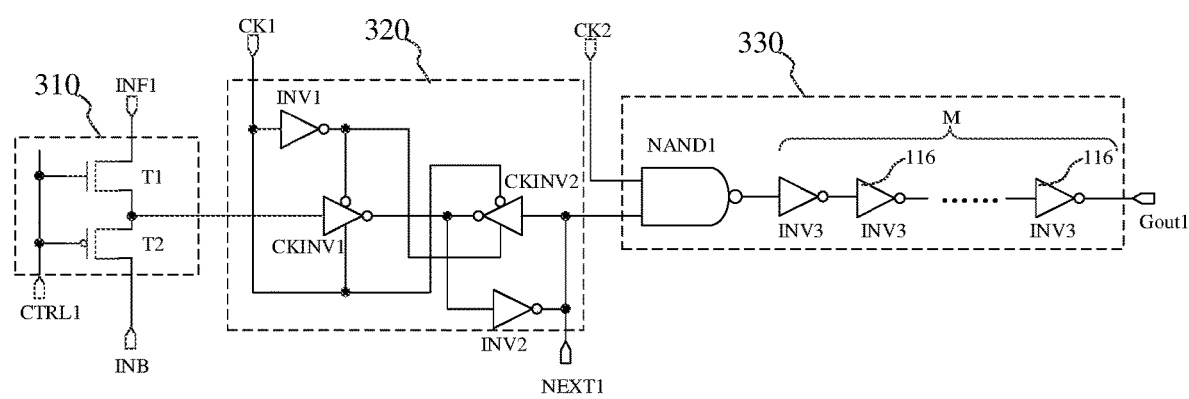
FIG. 16 is a schematic circuit diagram of a first shift register according to an embodiment of the present disclosure.

On the basis of the above-mentioned technical solutions, FIG. 16 is a schematic circuit diagram of a first shift register according to an embodiment of the present disclosure. As shown in FIG. 16, the first input module 310 of the first shift register further includes a first transistor T1 and a second transistor T2. A first electrode of the first transistor T1 is connected to the first trigger signal input end INF1, and a second electrode of the first transistor T1 is electrically connected to a first electrode of the second transistor T2. A gate of the first transistor T1 and a gate of the second transistor T2 are connected to the first input end IN1 of the first input module 310, that is, connected to the first control signal line CTRL1.

The first shift module 320 of the first shift register further includes a first inverter INV1, a second inverter INV2, a first clock inverter CKINV1 and a second clock inverter CKINV2. An input end of the first inverter INV1 is connected to the first clock signal input end CK1 of the first shift module 320. An input end of the first clock inverter CKINV1 is electrically connected to the second electrode of the first transistor T1, a first control end of the first clock inverter CKINV1 is electrically connected to an output end of the first inverter INV1, a second control end of the first clock inverter CKINV1 is electrically connected to the first clock input end CK1, and an output end of the first clock inverter CKINV1 is electrically connected to an output end of the second clock inverter CKINV2. An input end of the second clock inverter CKINV2 is electrically connected to an output end of the second inverter INV2. A first control end of the second clock inverter CKINV2 is electrically connected to the first clock input end CK1. A second control end of the second clock inverter CKINV2 is electrically connected to the output end of the first inverter INV1. An input end of the second inverter INV2 is connected to the output end of the first clock inverter CKINV1, and the output end of the second inverter INV2 is connected to the first trigger signal output end NEXT1 of the respective one of the multiple first shift registers.

The first enable and output module 330 of the first shift register further includes a first NAND gate NAND1 and at least one third inverter INV3. A first input end of the first NAND gate NAND1 is electrically connected to the second clock signal input end CK2 of the first enable and output module 330, a second input end of the first NAND gate NAND1 is electrically connected to the output end of the second inverter INV2, and the at least one third inverter INV3 is sequentially connected in series between an output end of the first NAND gate NAND1 and the output end Gout1 of the respective one of the multiple first registers.

Figure 17:
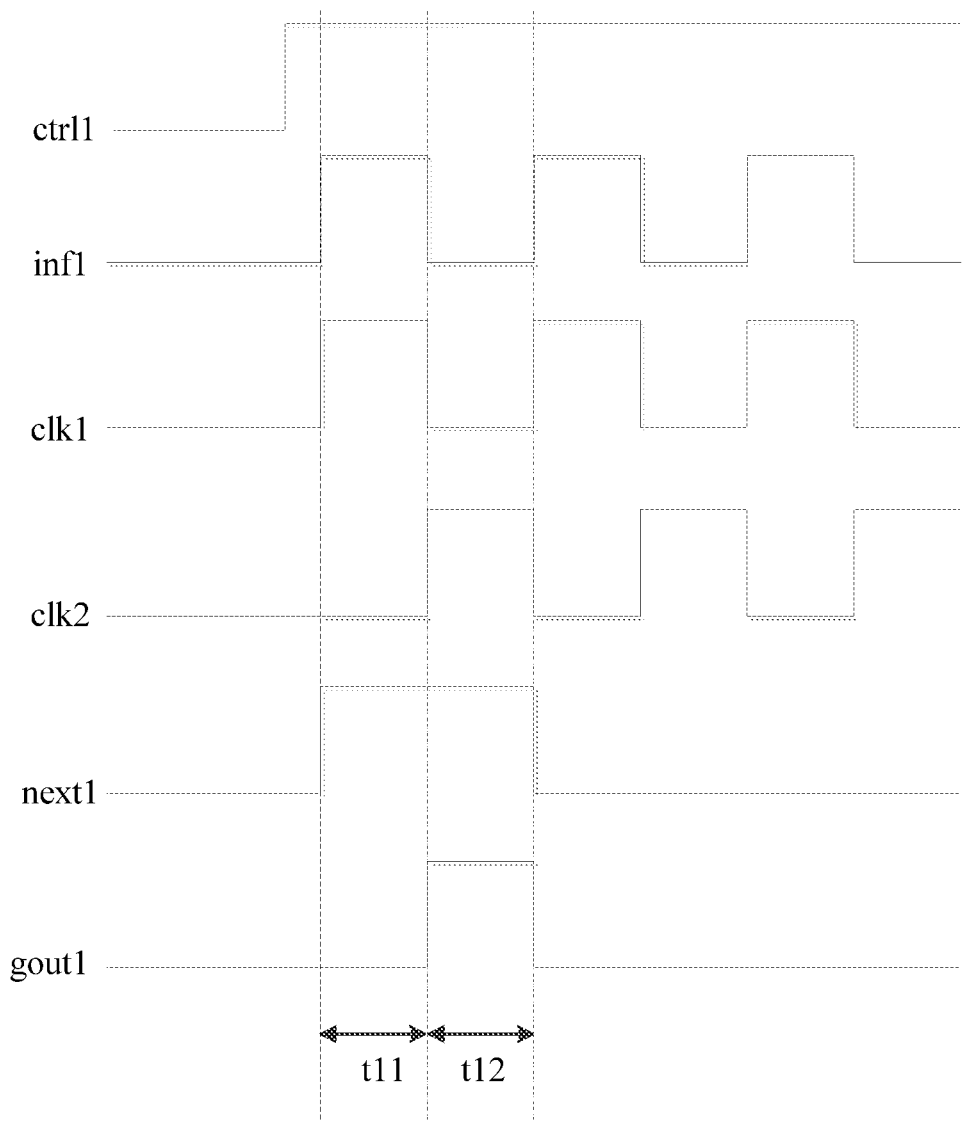
FIG. 17 is a diagram illustrating a timing sequence of a first shift register according to an embodiment of the present disclosure.

FIG. 17 is a diagram illustrating a timing sequence of a first shift register according to an embodiment of the present disclosure. The working principle of the first shift registers is described in conjunction with FIG. 16 and FIG. 17. Inf1 represents the signal input by the first trigger signal input end INF1, ctrl1 represents the signal input by the first control signal line CTRL1, clk1 represents the signal input by the first clock signal line CLK1, clk2 represents the signal input by the second clock signal line CLK2, next1 represents the signal output by the first trigger signal output end NEXT1, and gout1 represents the signal output by the output end Gout1 of the first shift register.

In stage t11, a high-level signal is input to the first control signal line CTRL1, the high-level signal is input through the first trigger signal input end INF1, and the high-level signal is input through the first clock signal input end CK1. The first transistor T1 is in a conductive state, the high-level signal input through the first trigger signal input end INF1 is transmitted to the input end of the first clock inverter CKINV1. In this case, the first clock inverter CKINV1 is equivalent to an inverter, the second clock inverter CKINV2 is in a high-impedance state, and the input end and the output end of the second clock inverter CKINV2 are disconnected. The trigger signal input by the first trigger signal input end INF1 is transmitted to the first trigger signal output end NEXT1 via the first clock inverter CKINV1 and the second inverter INV2. The first trigger signal output end NEXT1 outputs a high-level signal. A low-level signal is input through the second clock signal input end CK2, after the action of the first NAND gate NAND1 and the third inverter INV3, the low-level signal is output through the output end Gout1 of the first shift register.

In stage t12, a low-level signal is input through the first clock signal input end CK1, a high-level signal is input through the second clock signal input end CK2. The first clock inverter CKINV1 is equivalent to be in a high-impedance state, and the input end and the output end of the first clock inverter CKINV1 are disconnected. The second clock inverter CKINV2 is equivalent to an inverter. The connection relation of the second clock inverter CKINV2 and the second inverter INV2 is equivalent to two inverters connected in inverse parallel. The first trigger signal output end NEXT1 outputs a high-level signal. After the action of the first NAND gate NAND1 and the third inverter INV3, the high-level signal is output through the output end Gout1 of the first shift register.

In the stage after t12, a high-level signal is input through the first clock inverter CKINV1, a low-level signal is input through the first trigger signal input end INF1, the first transistor T1 in a conductive state, the low-level signal input by the first trigger signal input end INF1 is transmitted to the input end of the first clock inverter CKINV1. A high-level signal is input through the first clock signal input end CK1, the first clock inverter CKINV1 is equivalent to an inverter, the second clock inverter CKINV2 is in a high-impedance state, and the input end and the output end of the second clock inverter CKINV2 are disconnected. The trigger signal input through the first trigger signal input end INF1 is transmitted to the first trigger signal output end NEXT1 via the first clock inverter CKINV1 and the second inverter INV2. A Low-level signal is output through the first trigger signal output end NEXT1. The low-level signal is input through the second clock signal input end CK2, after the action of the first NAND gate NAND1 and the third inverter INV3, and the low-level signal is output through the output end of the first shift register.

M and N in general are positive integer, and selected odd numbers.

Figure 18:
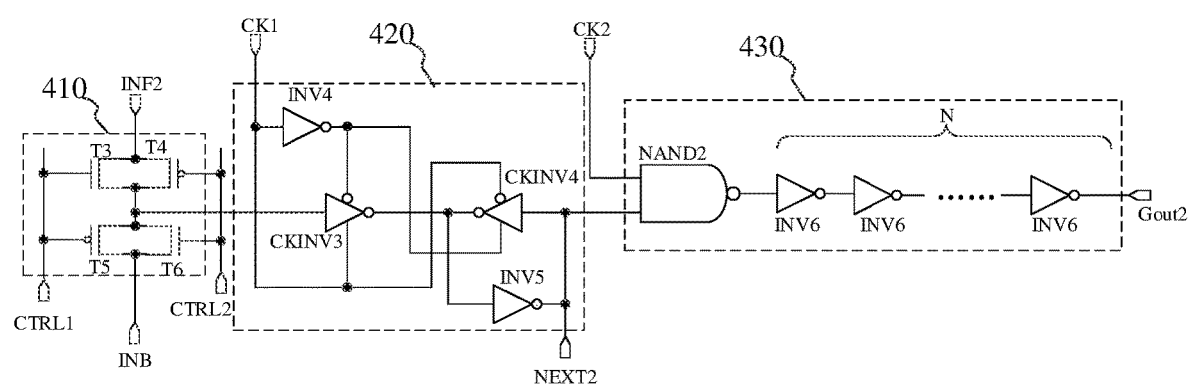
FIG. 18 is a schematic circuit diagram of a second shift register according to an embodiment of the present disclosure.

On the basis of the above-mentioned technical solutions, FIG. 18 is a schematic circuit diagram of a second shift register according to an embodiment of the present disclosure. As shown in FIG. 18, the second input module 410 of each of the multiple second shift registers further includes a third transistor T3, a fourth transistor T4, a fifth transistor T5 and a sixth transistor T6.

A first electrode of the third transistor T3 and a first electrode of the fourth transistor T4 are connected to the second trigger signal input end INF2. A second electrode of the third transistor T3 is connected to a second electrode of the fourth transistor T4. A gate of the third transistor T3 and a gate of the fifth transistor T5 are connected to the first control signal line CTRL1, and a gate of the fourth transistor T4 and a gate of the sixth transistor T6 are connected to the second control signal line CTRL2. A first electrode of the fifth transistor T5 and a first electrode of the sixth transistor T6 are connected to the third trigger signal input end INB, and a second electrode of the fifth transistor T5 and a second electrode of the sixth transistor T6 are connected to the second electrode of the third transistor T3.

The second shift module 420 of each of the multiple second shift registers further includes a fourth inverter INV4, a fifth inverter INV5, a third clock inverter CKINV3 and a fourth clock inverter CKINV4. An input end of the fourth inverter INV4 is connected to the first clock signal input end CK1 of the second shift module 420. An input end of the third clock inverter CKINV3 is electrically connected to the second electrode of the third transistor T3. A first control end of the third clock inverter CKINV3 is electrically connected to an output end of the fourth inverter INV4, and a second control end of the third clock inverter CKINV3 is electrically connected to the first clock signal input end CK1 of the second shift module 420. An output end of the third clock inverter CKINV3 is electrically connected to an output end of the fourth clock inverter CKINV4. An input end of the fourth clock inverter CKINV4 is electrically connected to an output end of the fifth inverter INV5. A first control end of the fourth clock inverter CKINV4 is electrically connected to the first clock signal input end CK1 of the second shift module 420, and a second control end of the fourth clock inverter CKINV4 is electrically connected to the output end of the fourth inverter INV4. An input end of the fifth inverter INV5 is connected to the output end of the third clock inverter CKINV3, and the output end of the fifth inverter INV5 is connected to the second trigger signal output end NEXT2 of the respective one of the multiple second shift registers.

The second enable and output module 430 of the second shift register further includes a second NAND gate NAND2 and at least one sixth inverter INV6. A first input end of the second NAND gate NAND2 is electrically connected to the second clock signal input end CK2, a second input end of the second NAND gate NAND2 is electrically connected to the output end of the fifth inverter INV5, and the at least one sixth inverter INV6 is sequentially connected in series between an output end of the second NAND gate NAND2 and the output end Gout2 of the respective one of the multiple second registers.

Figure 19:
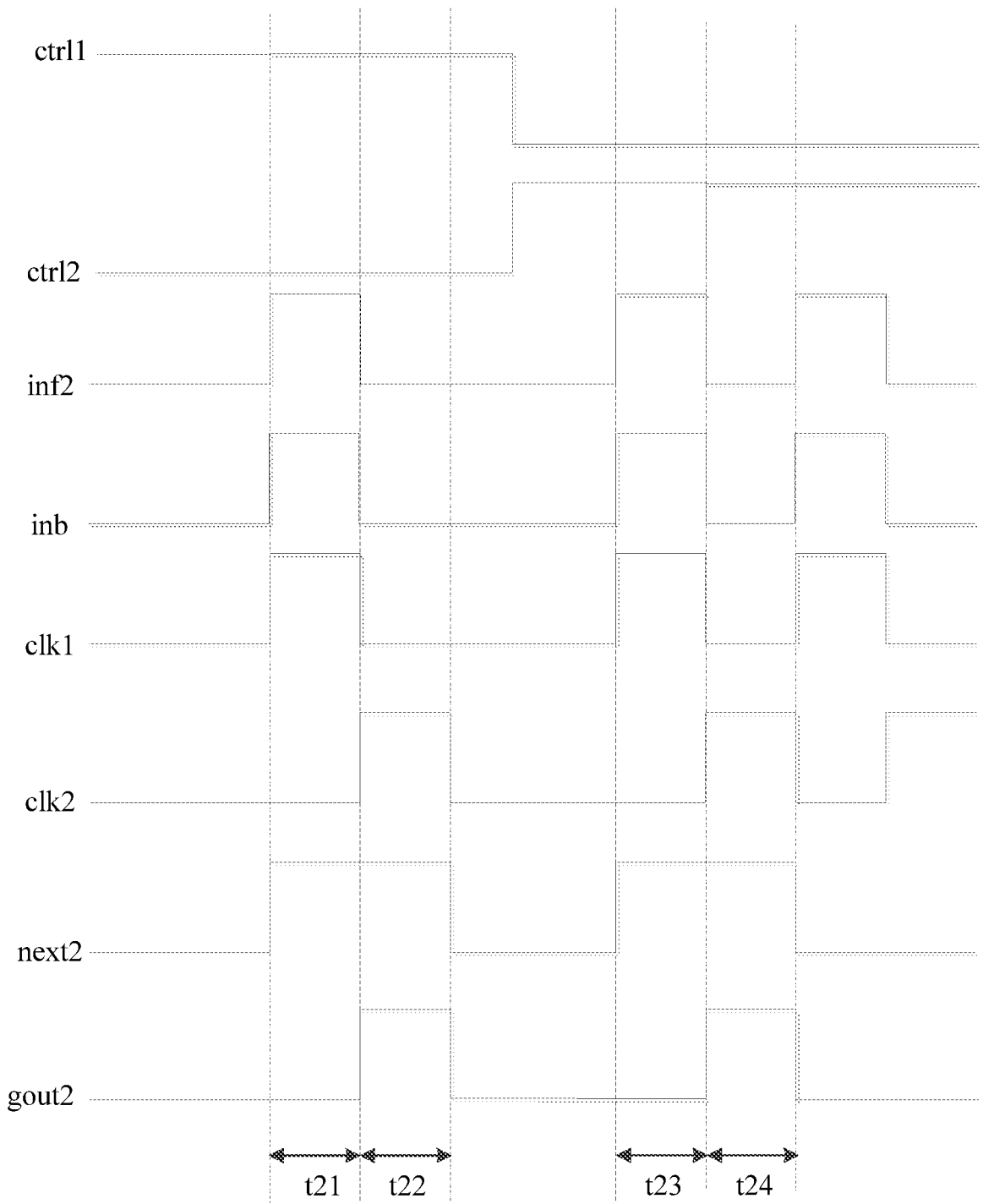
FIG. 19 is a diagram illustrating a timing sequence of a second shift register according to an embodiment of the present disclosure.

FIG. 19 is a diagram illustrating a timing sequence of a second shift register according to an embodiment of the present disclosure. The working principle of the second shift register is described in conjunction with FIG. 18 and FIG. 19. Inf2 represents the signal input by the first trigger signal input end INF2, Inb represents the signal input by the first trigger signal input end INB, ctrl1 represents the signal input by the first control signal line CTRL1, ctrl2 represents the signal input by the second control signal line CTRL2, clk1 represents the signal input by the first clock signal line CLK1, clk2 represents the signal input by the second clock signal line CLK2, next2 represents the signal output by the first trigger signal output end NEXT2, and gout2 represents the signal output by the output end Gout2 of the first shift register, t21 and t22 may represent a control timing sequence stage of the second shift register scanning along the first direction, t23 and t24 may represent a control timing sequence stage of the second shift register scanning along the second direction, and the first direction is opposite to the second direction. When the second shift register is controlled to scan along the first direction, ctrl1 is a high-level signal and ctrl2 is a low-level signal. When the second shift register is controlled to scan along the second direction, ctrl1 is a low-level signal and ctrl2 is a high-level signal.

In stage t21, a high-level signal is input through the first control signal line CTRL1, a low-level signal is input through the second control signal line CTRL2, a high-level signal is input through the second trigger signal input end INF2, and a high-level signal is input through the first clock signal input end CK1. The third transistor T3 and the fourth transistor T4 are in a conductive state, the high-level signal input by the second trigger signal input end INF2 is transmitted to the input end of the third clock inverter CKINV3. In this case, the third clock inverter CKINV3 is equivalent to an inverter, the fourth clock inverter CKINV4 is in a high-impedance state, and the input end and the output end of the fourth clock inverter CKINV4 are disconnected. The trigger signal input by the second trigger signal input end INF2 is transmitted to the second trigger signal output end NEXT2 via the third clock inverter CKINV3 and the fourth inverter INV4, and the second trigger signal output end NEXT2 outputs the high-level signal. The second clock signal input end CK2 inputs the low-level signal, after the action of the second NAND gate NAND2 and the sixth inverter INV6, the output end Gout2 of the second shift register outputs the low-level signal.

In stage t22, a low-level signal is input through the first clock signal input end CK1, and a high-level signal is input through the second clock signal input end CK2. The third clock inverter CKINV3 is equivalent to be in a high-impedance state, and the input end and the output end of the third clock inverter CKINV3 are disconnected. The fourth clock inverter CKINV4 is equivalent to an inverter. The connection relation of the fourth clock inverter CKINV4 and the fourth inverter INV4 is equivalent to two inverters connected in inverse parallel. The second trigger signal output end NEXT2 outputs the high-level signal. After the action of the second NAND gate NAND2 and the sixth inverter INV6, the output end Gout2 of the second shift register outputs the high-level signal.

In stage t23, a low-level signal is input through the first control signal line CTRL1, a high-level signal is input through the second control signal line CTRL2, a high-level signal is input through the third trigger signal input end INB, and a high-level signals is input through the first clock signal input end CK1. The fifth transistor T5 and the sixth transistor T6 are in a conductive state, the high-level signal input by the third trigger signal input end INB is transmitted to the input end of the third clock inverter CKINV3. In this case, the third clock inverter CKINV3 is equivalent to an inverter, the fourth clock inverter CKINV4 is in a high-impedance state, and the input end and the output end of the fourth clock inverter CKINV4 are disconnected. The trigger signal input by the second trigger signal input end INF2 is transmitted to the second trigger signal output end NEXT2 via the third clock inverter CKINV3 and the fourth inverter INV4, and the second trigger signal output end NEXT2 outputs the high-level signal. The second clock signal input end CK2 inputs the low-level signal, after the action of the second NAND gate NAND2 and the sixth inverter INV6, the output end Gout2 of the second shift register outputs the low-level signal.

In stage t24, a low-level signal is input through the first clock signal input end CK1, and a high-level signal is input through the second clock signal input end CK2. The third clock inverter CKINV3 is equivalent to be in a high-impedance state, and the input end and the output end of the third clock inverter CKINV3 are disconnected. The fourth clock inverter CKINV4 is equivalent to an inverter. The connection relation of the fourth clock inverter CKINV4 and the fourth inverter INV4 is equivalent to two inverters connected in inverse parallel. The second trigger signal output end NEXT2 outputs the high-level signal. After the action of the second NAND gate NAND2 and the sixth inverter INV6, the output end Gout2 of the second shift register outputs the high-level signal.

In the above-mentioned process, in stage t21 and stage t22, the scanning direction of the multiple stages of second shift registers 202 is from the preceding one of the two adjacent stages of the multiple second shift registers 202 to the succeeding one of the two adjacent stages of the multiple second shift registers 202. In stage t23 and stage t24, the scanning direction of the multiple stages of the second shift registers 202 is from the succeeding one of the two adjacent stages of the multiple second shift registers 202 to the preceding one of the two adjacent stages of the multiple second shift registers 202.

Figure 20:
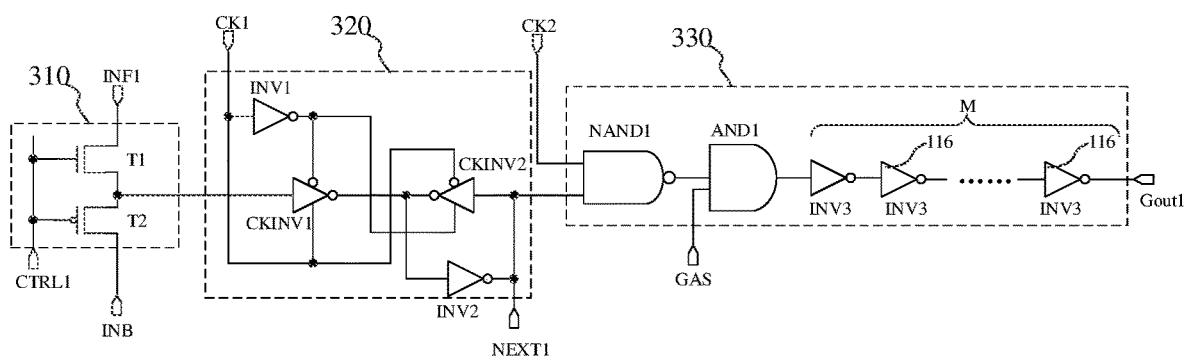
FIG. 20 is a schematic circuit diagram of another first shift register according to an embodiment of the present disclosure.
Figure 21:
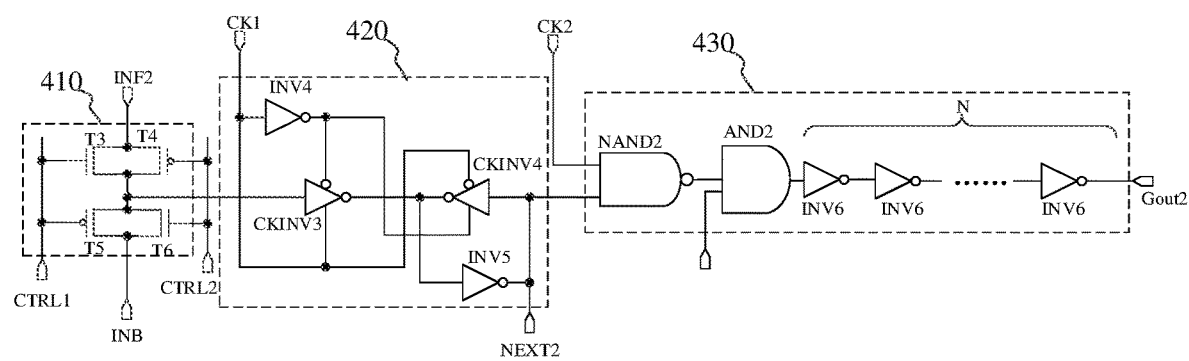
FIG. 21 is a schematic circuit diagram of another second shift register according to an embodiment of the present disclosure.

On the basis of the above-mentioned technical solutions, FIG. 20 is a schematic circuit diagram of another first shift register according to an embodiment of the present disclosure, the display panel further includes an all-gate-on control signal line GAS. The first enable and output module 330 further includes a first AND gate AND1, and the first AND gate AND1 is connected between the first NAND gate NAND1 and a first one of the at least one third inverter INV3. A first input end of the first AND gate AND1 is connected to the output end of the first NAND gate NAND1. A second input end of the first AND gate AND1 is connected to the all-gate-on control signal line GAS, and an output end of the first AND gate AND1 is connected to an input end of the first one of the at least one third inverter INV3. FIG. 21 is a schematic circuit diagram of another second shift register according to an embodiment of the present disclosure. The second enable and output module 430 further includes a second AND gate AND2. The second AND gate AND2 is connected between the second NAND gate NAND2 and a first one of the at least one sixth inverter INV6. A first input end of the second AND gate AND2 is connected to the output end of the second NAND gate NAND2, a second input end of the second AND gate AND2 is connected to the all-gate-on control signal line GAS, and an output end of the second AND gate AND2 is connected to an input end of the first one of the at least one sixth inverter INV6.

In one or more embodiments, when the display panel is in a driving process of one frame and an all-gate-on control signal output by the all-gate-on control signal line GAS is a high-level signal, a level output by the first AND gate AND1 is the level of the first NAND gate NAND1, a level output by the second AND gate AND2 is the level of the second NAND gate NAND2, in this case, the first AND gate AND1 and the second AND gate AND2 are both not working. When the one frame driving of the display panel is finished, before the beginning of a next frame driving, and the all-gate-on control signal output by the all-gate-on control signal line GAS is a low-level signal, whether the first NAND gate NAND1 outputs a high-level signal or a low-level signal, the first AND gate AND1 outputs a low-level signal, and after the action of the third inverter INV3, the output end Gout2 of the second shift register outputs a high-level signal. Alternatively, whether the second NAND gate NAND2 outputs a high-level signal or a low-level signal, the second AND gate AND2 outputs a low-level signal, and after the action of the sixth inverter INV6, the output end Gout2 of the second shift register outputs a high-level signal. Therefore, a fully discharge can be performed to the first shift register and the second shift register to avoid the shadow and shake of pictures and improve a display quality.

Figure 22:
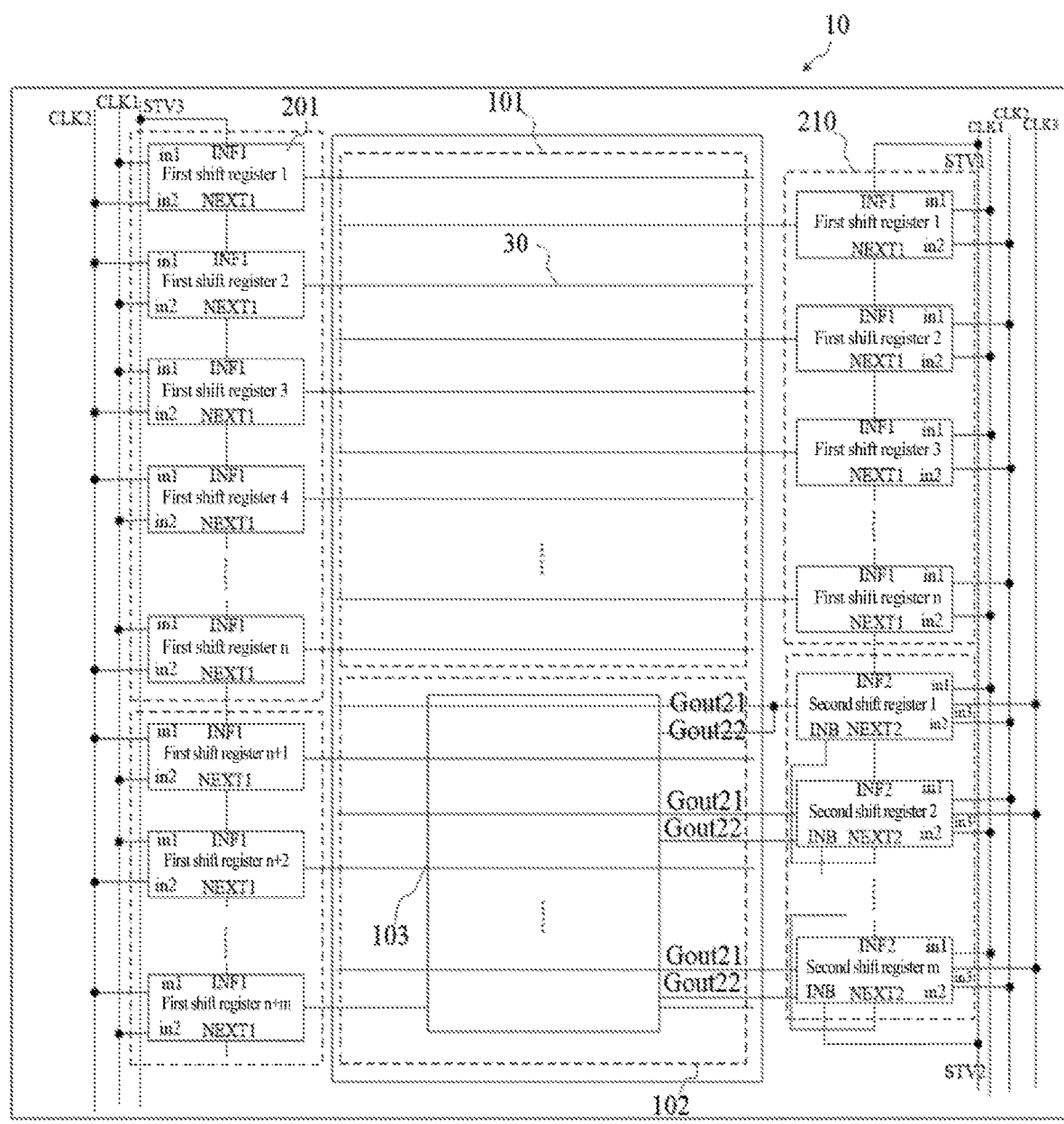
FIG. 22 is a structural diagram of another display panel according to an embodiment of the present disclosure.
Figure 23:
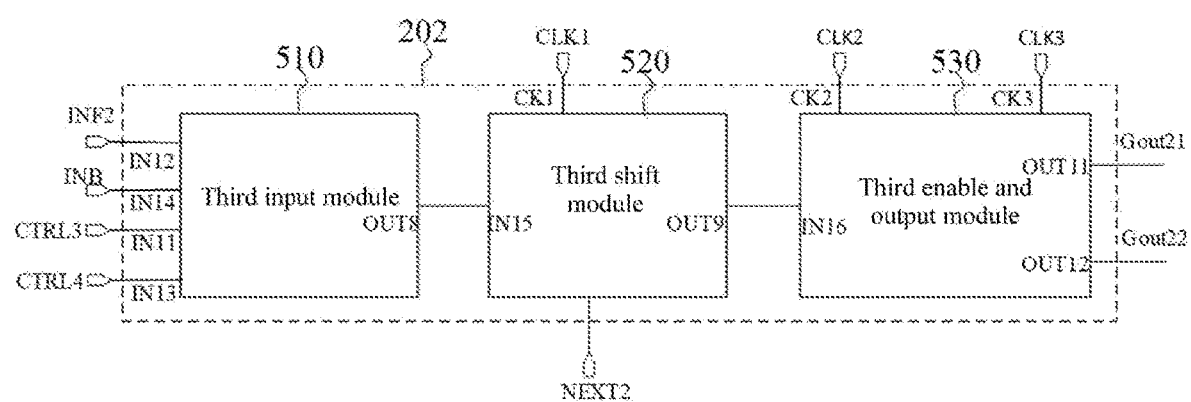
FIG. 23 is a structural diagram of another second shift register according to an embodiment of the present disclosure.

FIG. 22 is a structural diagram of another display panel according to an embodiment of the present disclosure, and FIG. 23 is a structural diagram of another second shift register according to an embodiment of the present disclosure. As shown in FIG. 22 and FIG. 23, the display panel further includes a third clock signal line CLK3. Each of the multiple second shift registers 202 includes a third clock signal input end in3, a first output end Gout21 and a second output end Gout22. The first output end Gout21 the each of the multiple second shift registers 202 is connected to a respective one of the multiple scanning lines 30 in the second display area 102 and the second output end Gout22 the each of the multiple second shift registers 202 is connected to a respective one of the multiple fingerprint identification units.

The display panel further includes a third control signal line CTRL3 and a fourth control signal line CTRL4. Each of the multiple second shift registers further includes a third input module 510, a third shift module 520 and a third enable and output module 530. The third input module includes a first input end IN11, a second input end IN12, a third input end IN13 and a fourth input end IN14. The first input end IN11 of the third input module 510 is connected to the third control signal line CTRL3, the second input end IN12 of the third input module 510 serves as the second trigger signal input end INF2 of the respective one of the multiple second shift registers 202, the third input end IN13 of the third input module 510 is connected to the fourth control signal line CTRL4, and the fourth input end IN14 of the third input module 510 serves as the third trigger signal input end INB of the respective one of the multiple second shift registers. The third input module is configured to output a shift control signal. The third shift module 520 includes a first clock signal input end CK1, a first input end IN15 and an output end OUT9. The input end IN15 of the third shift module 520 is connected to the output end OUT8 of the third input module 510, and the third shift module 520 is configured to output a shift signal according to the shift control signal input by the first input end IN15 of the third shift module and a clock signal input by the first clock signal input end CK1 of the third shift module. The third enable and output module 530 includes a second clock signal input end CK2, a third clock signal input end CK3, an input end IN16, a first output end OUT11 and a second output end OUT12. The second clock signal input end CK2 of the third enable and output module 53 is connected to the second clock signal line CLK2, the third clock signal input end CK3 of the third enable and output module 530 is connected to the third clock signal line CLK3, and the input end of the third enable and output module 530 is connected to the output end OUT9 of the third shift module 520. The third enable and output module 530 is configured to output a scanning signal on the first output end OUT11 of the third enable and output module 530 according to the shift signal input by the input end IN16 of the third enable and output module 530 and a clock signal input by the second signal input end CK2 of the third enable and output module 530. And the third enable and output module 530 is further configured to output a control signal on the second output end OUT12 of the third enable and output module 530 according to the shift signal input by the input end IN16 of the third enable and output module 530 and a clock signal input by the third clock signal input end CK3 of the third enable and output module 530. The first output end OUT11 of the third enable and output module 530 serves as the first output end Gout21 of the respective one of the multiple second shift registers, and the second output end OUT12 of the third enable and output module 530 serves as the second output end Gout22 of the respective one of the multiple second shift registers.

In one or more embodiments, when a trigger signal is input through the first input end IN11 of the third input module 510 and the second input end IN12 of the third input module 510, the scanning direction of the multiple stages of the second shift registers 202 is from the preceding one of the two adjacent stages of the multiple second shift registers 202 to the succeeding one of the two adjacent stages of serves as second shift registers 202, and a scanning signal is output through the first output end OUT11 of the respective one of the multiple second shift registers. In this case, the level value of the scanning signal is controlled via configuring the first clock signal input end CK1 and the second clock signal input end CK2. When a trigger signals is input through the third input end IN13 of the third input module 510 and the fourth input end IN14 of the third input module 510, the scanning direction of the multiple stages of second shift registers 202 is from the succeeding one of the two adjacent stages of the multiple second shift registers 202 to the preceding one of the two adjacent stages of the multiple second shift registers, and a control signal is output through the second output end OUT12 the respective one of the multiple second shift registers. In this case, the level value of the scanning signal is controlled via configuring the first clock signal input end CK1 and the third clock signal input end CK3.

Figure 24:
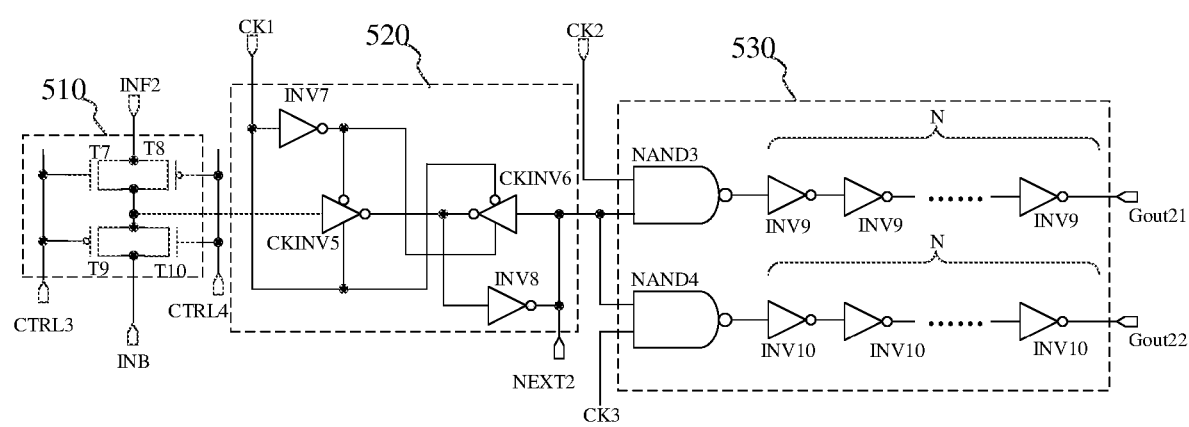
FIG. 24 is a schematic circuit diagram of another second shift register according to an embodiment of the present disclosure.

On the basis of the above-mentioned technical solutions, FIG. 24 is a schematic circuit diagram of another second shift register according to an embodiment of the present disclosure. The second shift register can be used in the display panel shown in FIG. 22, as shown in FIG. 24. The third input module 510 of the second shift register further includes a seventh transistor T7, an eighth transistor T8, a ninth transistor T9 and a tenth transistor T10. A first electrode of the seventh transistor T7 and a first electrode of the eighth transistor T8 are connected to the second trigger signal input end INF2. A second electrode of the seventh transistor T7 is connected to a second electrode of the eighth transistor T8. A gate of the seventh transistor T7 and a gate of the ninth transistor T9 are connected to the third control signal line CTRL3, and a gate of the eighth transistor T8 and a gate of the tenth transistor T10 are connected to the fourth control signal line CTRL4. A first electrode of the ninth transistor T9 and a first electrode of the tenth transistor T10 are connected to the third trigger signal input end INB. A second electrode of the ninth transistor T9 and a second electrode of the tenth transistor T10 are connected to the second electrode of the seventh transistor T7.

The third shift module 520 of the second trigger further includes a seventh inverter INV7, an eighth inverter INV8, a fifth clock inverter CKINV5 and a sixth clock inverter CKINV6. An input end of the seventh inverter INV7 is connected to the first clock signal input end CK1. An input end of the fifth clock inverter CKINV5 is electrically connected to the second electrode of the seventh transistor T7. A first control end of the fifth clock inverter CKINV5 is electrically connected to an output end of the seventh inverter INV7. A second control end of the fifth clock inverter CKINV5 is electrically connected to the first clock signal input end CK1, and an output end of the fifth clock inverter CKINV5 is electrically connected to an output end of the sixth clock inverter CKINV6. An input end of the sixth clock inverter CKINV is electrically connected to the output end of the seventh inverter INV7. A first control end of the sixth clock inverter CKINV6 is electrically connected to the first clock signal input end CK1, and a second control end of the sixth clock inverter CKINV6 is electrically connected to an output end of the eighth inverter INV8. An input end of the eighth inverter INV8 is connected to the output end of the fifth clock inverter CKINV5, and the output end of the eighth inverter INV8 serves as the second trigger signal output end NEXT2 of the respective one of the multiple second shift registers.

The third enable and output module 530 of the second shift register further includes a third NAND gate NAND3, a fourth NAND gate NAND4, at least one ninth inverter INV9 and at least one tenth inverter INV10. A first input end of the third NAND gate NAND3 is electrically connected to the second clock signal input end CK2, a second input end of the third NAND gate NAND3 is electrically connected to the output end of the eighth inverter INV8, and the at least one ninth inverter INV9 is sequentially connected in series between an output end of the third NAND gate NAND3 and the first output end Gout21 of the respective one of the multiple second shift registers. A first input end of the fourth NAND gate NAND4 is electrically connected to the third clock signal input end CK3, a second input end of the fourth NAND gate NAND4 is electrically connected to the output end of the eighth inverter INV8, and the at least one tenth inverter INV10 is sequentially connected in series between an output end of the fourth NAND gate NAND4 and the second output end Gout22 of the respective one of the multiple second shift registers.

Figure 25:
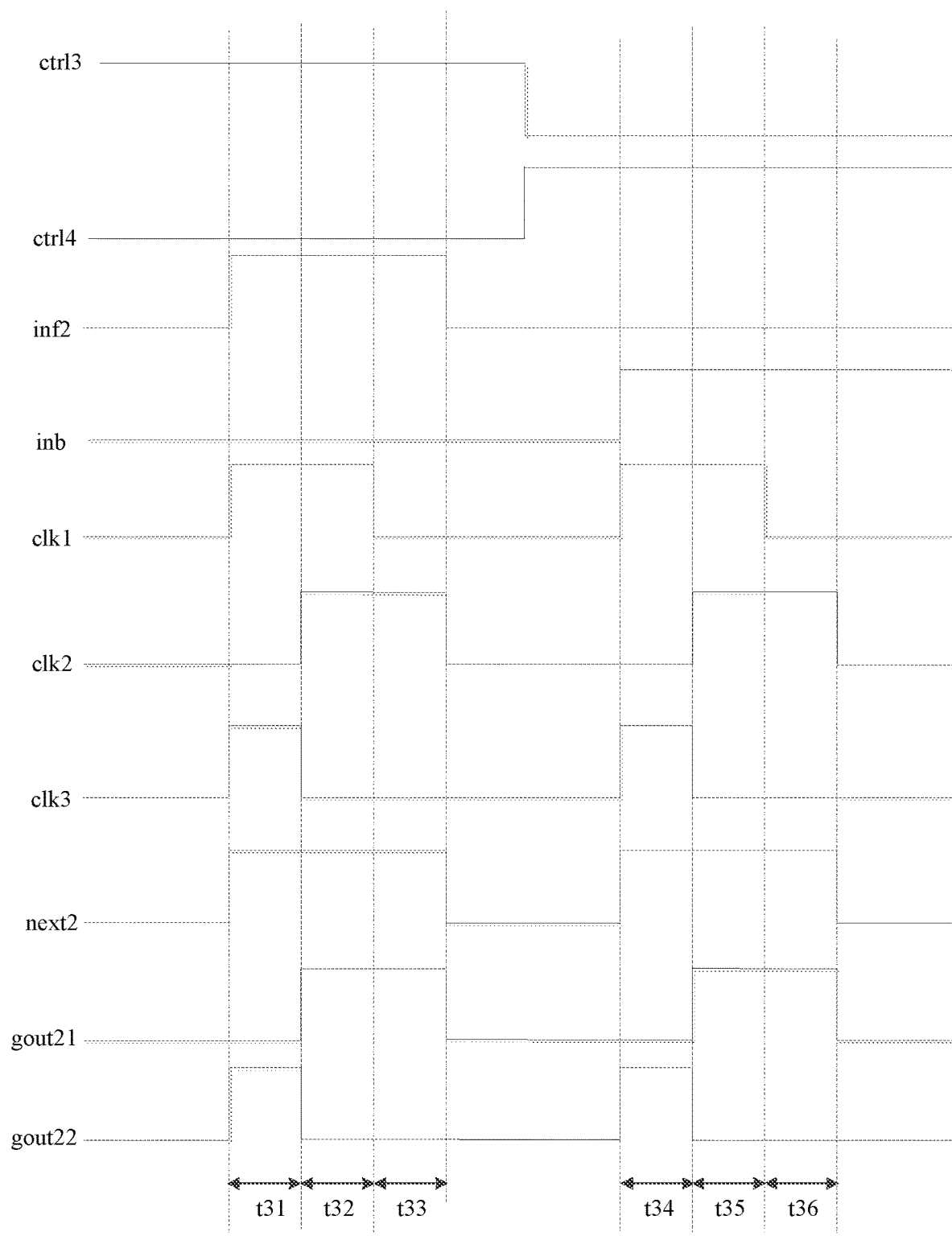
FIG. 25 is a diagram illustrating a timing sequence of another second shift register according to an embodiment of the present disclosure.

FIG. 25 is a diagram illustrating a timing sequence of another second shift register according to an embodiment of the present disclosure. The working principle of the second shift register is described in conjunction with FIG. 24 and FIG. 25. Inf2 represents the signal input by the first trigger signal input end INF2, Inb represents the signal input by the first trigger signal input end INB, ctrl3 represents the signal input by the third control signal line CTRL3, ctrl4 represents the signal input by the fourth control signal line CTRL4, clk1 represents the signal input by the first clock signal line CLK1, clk2 represents the signal input by the second clock signal line CLK2, clk3 represents the signal input by the third clock signal line CLK3, next2 represents the signal output by the first trigger signal output end NEXT2, gout21 represents the signal output by the first output end Gout21 of the second shift register, and gout22 represents the signal output by the second output end Gout22 of the second shift register. t31, t32 and t33 may represent the control timing sequence stage of the second shift register scanning along the first direction, t34, t35 and t36 may represent the control timing sequence stage of the second shift register scanning along the second direction, and the first direction is opposite to the second direction. When the second shift register is controlled to scan along the first direction, ctrl3 is a high-level signal and ctrl4 is a low-level signal, and when the second shift register is controlled to scan along the second direction, ctrl3 is a low-level signal and ctrl4 is a high-level signal.

In stage t31, a high-level signal is input through the third control signal line CTRL3, a low-level signal is input through the fourth control signal line CTRL4, a high-level signal is input through the second trigger signal input end INF2, and a high-level signal is input through the first clock signal input end CK1. The seventh transistor T7 and the eighth transistor T8 are in a conductive state, the high-level signal input by the second trigger signal input end INF2 is transmitted to the input end of the fifth clock inverter CKINV5. In this case, the fifth clock inverter CKINV5 is equivalent to an inverter, the sixth clock inverter CKINV6 is in a high-impedance state, and the input end and the output end of the sixth clock inverter CKINV6 are disconnected. The trigger signal input by the second trigger signal input end INF2 is transmitted to the second trigger signal output end NEXT2 via the fifth clock inverter CKINV5 and the eighth inverter INV8, and a high-level signal is output through the second trigger signal output end NEXT2. A low-level signal is input through the second clock signal input end CK2, a high-level signal is input through the third clock signal input end CK3, after the action of the third NAND gate NAND3 and the ninth inverter INV9, and a low-level signal is output through the first output end Gout21 of the second shift register. After the action of the fourth NAND gate NAND4 and the tenth inverter INV10, a high-level signal is output through the second output end Gout22 of the second shift register.

In stage t32, a high-level signal is input through the second clock signal input end CK2, a low-level signal is input through the third clock signal input end CK3, a high-level signal is output through the first output end Gout21 of the second shift register, and a low-level signal is output through the second output end Gout22 of the second shift register.

In stage t33, a low-level signal is input through the first clock signal input end CK1, a high-level signal is input through the second clock signal input end CK2, a low-level signal is input through the third clock signal input end CK3, a high-level signal is output through the first output end Gout21 of the second shift register, and a low-level signal is output through the second output end Gout22 of the second shift register.

In stage t34, a low-level signal is input through the third control signal line CTRL3, a high-level signal is input through the fourth control signal line CTRL4, a high-level signal is input through the third trigger signal input end INB, and a high-level signal is input through the first clock signal input end CK1. The ninth transistor T9 and the tenth transistor T10 are in a conductive state, the high-level signal input by the third trigger signal input end INB is transmitted to the input end of the fifth clock inverter CKINV5. In this case, the fifth clock inverter CKINV5 is equivalent to an inverter, the sixth clock inverter CKINV6 is in a high-impedance state, and the input end and the output end of the sixth clock inverter CKINV6 are disconnected. The trigger signal input by the second trigger signal input end INF2 is transmitted to the second trigger signal output end NEXT2 via the fifth clock inverter CKINV5 and the eighth inverter INV8, and a high-level signal is output through the second trigger signal output end NEXT2. A low-level signal is input through the second clock signal input end CK2, a high-level signal is input through the third clock signal input end CK3, and a low-level signal is output through the first output end Gout21 of the second shift register. A high-level signal is output through the second output end Gout22 of the second shift register.

In stage t35, a high-level signal is input through the second clock signal input end CK2, a low-level signal is input through the third clock signal input end CK3, a high-level signal is output through the first output end Gout21 of the second shift register, and a low-level signal is output through the second output end Gout22 of the second shift register.

In stage t36, a low-level signal is input through the first clock signal input end CK1, a high-level signal is input through the second clock signal input end CK2, a low-level signal is input through the third clock signal input end CK3, a high-level signal is output through the first output end Gout21 of the second shift register, and a low-level signal is output through the second output end Gout22 of the second shift register.

In the above-mentioned process, in stage t31 to stage t33 the scanning direction of the multiple stages of the second shift registers 202 is from the preceding one of the two adjacent stages of the multiple second shift registers 202 to the succeeding one of the two adjacent stages of the multiple second shift registers 202. In this case, the level value of the scanning signal output by the first output end Gout21 of the second shift register is controlled via controlling the signals input by the first clock signal input end CK1 and the second clock signal input end CK2. In stage t34 to stage t36 the scanning direction of the multiple stages of the second shift registers 202 is from the preceding one of the two adjacent stages of the multiple second shift registers 202 to the succeeding one of the two adjacent stages of the multiple second shift registers 202. In this case, the level value of the scanning signal output by the second output end Gout22 of the second shift register is controlled via controlling the signals input by the first clock signal input end CK1 and the third clock signal input end CK3.

Figure 26:
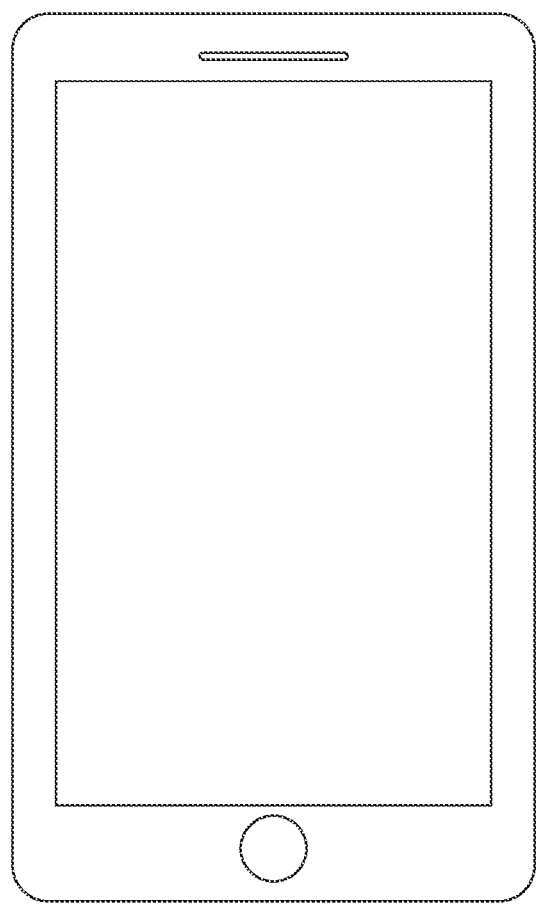
FIG. 26 illustrates a display device according to an embodiment of the present disclosure.

FIG. 26 illustrates a display device according to an embodiment of the present disclosure. The display device includes the display panel provided by any technical solutions in the present disclosure.

What is claimed is:

1. A display panel, comprising a display area and a non-display area, wherein
the display panel further comprises a plurality of cascaded shift registers disposed in the non-display area and a plurality of scanning lines disposed in the display area;
each of the plurality of shift registers is connected to a respective one of the plurality of scanning lines;
the plurality of shift registers comprise a plurality of first shift registers and a plurality of second shift registers, the plurality of first shift registers are capable of unidirectional scanning, and the plurality of second shift registers are capable of bidirectional scanning; and the display area comprises a first display area and a second display area, each of scanning lines in the first display area is connected to a respective one of the plurality of first shift registers, and each of at least part of scanning lines in the second display area is connected to a respective one of the plurality of second shift registers;

wherein the second display area is a special-shaped display area;

the plurality of first shift registers constitute at least one first shift register group, and first shift registers in each of the at least one first shift register group are cascaded; the plurality of second shift registers constitute at least one second shift register group, and second shift registers in each of the at least one second shift register group are cascaded; and on a same side of the display area,
 a first-stage first shift register in one of the at least one first shift register group and a last-stage second shift register in one of the at least one second shift register group are cascaded; or a last-stage first shift register in the one of the at least one first shift register group and a first-stage second shift register in the one of the at least one second shift register group are cascaded;

the display panel further comprises a first start signal line and a second start signal line, wherein each of the plurality of first shift registers comprises a first trigger signal input end and a first trigger signal output end; each of the plurality of second shift registers comprises a second trigger signal input end, a third trigger signal input end and a second trigger signal output end;

in two adjacent stages of the plurality of first shift registers, the first trigger signal input end of a succeeding one of the two adjacent stages of the plurality of first shift registers is connected to the first trigger signal output end of a preceding one of the two adjacent stages of the plurality of first shift registers; and in two adjacent stages of the plurality of second shift registers, the second trigger signal input end of a succeeding one of the two adjacent stages of the plurality of second shift registers is connected to the second trigger signal output end of a preceding one of the two adjacent stages of the plurality of second shift registers, and the second trigger signal output end of the succeeding one of the two adjacent stages of the plurality of second shift registers is connected to the third trigger signal input end of the preceding one of the two adjacent stages of the plurality of second shift registers; and on one side of the display area, the first trigger signal input end of a first stage of the plurality of first shift registers is connected to the first start signal line; the second trigger signal input end of a first stage of the plurality of second shift registers is connected to the first trigger signal output end of a last stage of the plurality of first shift registers, and the third trigger signal input end of a last stage of the plurality of first shift registers is connected to the second start signal line.

2. The display panel according to claim 1, wherein shift registers connected to the at least part of the scanning lines in the second display area are the second shift registers, and are disposed on one side or two opposite sides of the second display area.

3. The display panel according to claim 1, wherein the second display area comprises a fingerprint identification area, and the fingerprint identification area comprises a plurality of fingerprint identification units; and the second shift registers connected to the at least part of the scanning lines in the second display area are further configured to provide control signals for the plurality of fingerprint identification units.

4. The display panel according to claim 1, wherein the at least one first shift register group comprises two first shift register groups respectively disposed on a first side of the display area and a second side of the display area, the at least one second shift register group is disposed on the second side of the display area, and the first side is opposite to the second side.

5. The display panel according to claim 1, wherein the first start signal line and the second start signal line are a same signal line.

6. The display panel according to claim 5, further comprising a third start signal line, wherein the third start signal line is disposed on a first side of the display area, the first start signal line and the second start signal line are disposed on a second side of the display area; and on the first side of the display area, the first trigger signal input end of the first stage of the plurality of first shift registers is connected to the third start signal line.

7. The display panel according to claim 1, further comprising a first clock signal line and a second clock signal line, wherein the each of the plurality of shift registers further comprises a first clock signal input end and a second clock signal input end; and first clock signal input ends and second clock signal input ends of two adjacent stages of the plurality of shift registers are electrically connected in alternation to the first clock signal line and the second clock signal line.

8. The display panel according to claim 7, further comprising a first control signal line and a second control signal line, wherein a first control signal carried in the first control signal line and a second control signal carried in the second control signal line are mutually inverted signals;

each of the plurality of first registers comprises a first input module, a first shift module and a first enable and output module;

the first input module comprises a first input end and a second input end; the first input end of the first input module is connected to the first control signal line, and the second input end of the first input module serves as the first trigger signal input end of the respective one of the plurality of first registers;

the first input module is configured to output a shift control signal;

the first shift module comprises a first clock signal input end, a first input end and an output end;

the input end of the first shift module is connected to an output end of the first input module;

the first clock signal input end of the first shift module serves as the first clock signal input end of the respective one of the plurality of first registers;

the first shift module is configured to output a shift signal according to the shift control signal input by the first input end of the first shift module and a clock signal input by the first clock signal input end of the first shift module; and the first enable and output module comprises a second clock signal input end, an input end and an output end; the second clock signal input end of the first enable and output module serves as the second clock signal input end of the respective one of the plurality of first shift registers, the input end of the first enable and output module is connected to the output end of the first shift module, and the output end of the first enable and output module serves as an output end of the respective one of the plurality of first registers; and the first enable and output module is configured to output a scanning signal according to the shift signal input by the input end of the first enable and output module and a clock signal input by the second clock signal input end of the first enable and output module.

9. The display panel according to claim 8, wherein each of the plurality of second shift registers comprises a second input module, a second shift module and a second enable and output module;

the second input module comprises a first input end, a second input end, a third input end, a fourth input end and an output end;

the first input end of the second input module is connected to the first control signal line, the second input end of the second input module serves as the second trigger signal input end of the respective one of the plurality of second shift registers, the third input end of the second input module is connected to the second control signal line, the fourth input end of the second input module serves as the third trigger signal input end of the respective one of the plurality of second shift registers;

the output end of the second input module is configured to output a shift control signal;

the second shift module comprises a first clock signal input end, a first input end and an output end;

the input end of the second shift module is connected to the output end of the second input module, the first clock signal input end of the second shift module serves as the first clock signal input end of the second shift register;

the second shift module is configured to output a shift signal according to the shift control signal input by the first input end of the second shift module and a clock signal input by the first clock signal input end of the second shift module; and the second enable and output module comprises a second clock signal input end, an input end and an output end;

the second clock signal input end of the second enable and output module serves as the second clock signal input end of the respective one of the plurality of second shift registers, the input end of the second enable and output module is connected to the output end of the second shift module, and the output end of the second enable and output module serves as an output end of the respective one of the plurality of second registers; and the second enable and output module is configured to output a scanning signal according to the shift signal input by the input end of the second enable and output module and a clock signal input by the second clock signal input end of the second enable and output module.

10. The display panel according to claim 9, wherein the first input module further comprises a first transistor and a second transistor;

a first electrode of the first transistor is connected to the first trigger signal input end, and a second electrode of the first transistor is electrically connected to a first electrode of the second transistor;

a gate of the first transistor and a gate of the second transistor are connected to the first input end of the first input module;

the first shift module further comprises a first inverter, a second inverter, a first clock inverter and a second clock inverter;

an input end of the first inverter is connected to the first clock signal input end of the first shift module;

an input end of the first clock inverter is electrically connected to the second electrode of the first transistor, a first control end of the first clock inverter is electrically connected to an output end of the first inverter, a second control end of the first clock inverter is electrically connected to the first clock input end, and an output end of the first clock inverter is electrically connected to an output end of the second clock inverter;

an input end of the second clock inverter is electrically connected to an output end of the second inverter, a first control end of the second clock inverter is electrically connected to the first clock input end, and a second control end of the second clock inverter is electrically connected to the output end of the first inverter;

an input end of the second inverter is connected to the output end of the first clock inverter, and the output end of the second inverter is connected to the first trigger signal output end of the respective one of the plurality of first shift registers;

the first enable and output module further comprises a first NAND gate and at least one third inverter; and a first input end of the first NAND gate is electrically connected to the second clock signal input end of the first enable and output module, a second input end of the first NAND gate is electrically connected to the output end of the second inverter, and the at least one third inverter is sequentially connected in series between an output end of the first NAND gate and the output end of the respective one of the plurality of first registers.

11. The display panel according to claim 10, wherein the second input module further comprises a third transistor, a fourth transistor, a fifth transistor and a sixth transistor;

a first electrode of the third transistor and a first electrode of the fourth transistor are connected to the second trigger signal input end, and a second electrode of the third transistor is connected to a second electrode of the fourth transistor;

a gate of the third transistor and a gate of the fifth transistor are connected to the first control signal line, and a gate of the fourth transistor and a gate of the sixth transistor are connected to the second control signal line;

a first electrode of the fifth transistor and a first electrode of the sixth transistor are connected to the third trigger signal input end;

a second electrode of the fifth transistor and a second electrode of the sixth transistor are connected to the second electrode of the third transistor;

the second shift module further comprises a fourth inverter, a fifth inverter, a third clock inverter and a fourth clock inverter;

an input end of the fourth inverter is connected to the first clock signal input end of the second shift module;

an input end of the third clock inverter is electrically connected to the second electrode of the third transistor, a first control end of the third clock inverter is electrically connected to an output end of the fourth inverter, a second control end of the third clock inverter is electrically connected to the first clock signal input end of the second shift module, and an output end of the third clock inverter is electrically connected to an output end of the fourth clock inverter;

an input end of the fourth clock inverter is electrically connected to an output end of the fifth inverter, a first control end of the fourth clock inverter is electrically connected to the first clock signal input end of the second shift module, and a second control end of the fourth clock inverter is electrically connected to the output end of the fourth inverter;

an input end of the fifth inverter is connected to the output end of the third clock inverter, and the output end of the fifth inverter is connected to the second trigger signal output end of the respective one of the plurality of second shift registers;

the second enable and output module further comprises a second NAND gate and at least one sixth inverter; and a first input end of the second NAND gate is electrically connected to the second clock signal input end of the second enable and output module, a second input end of the second NAND gate is electrically connected to the output end of the fifth inverter, and the at least one sixth inverter is sequentially connected in series between an output end of the second NAND gate and the output end of the respective one of the plurality of second registers.

12. The display panel according to claim 11, further comprising an all-gate-on control signal line;

the first enable and output module further comprises a first AND gate, and the first AND gate is connected between the first NAND gate and a first one of the at least one third inverter;

a first input end of the first AND gate is connected to the output end of the first NAND gate, a second input end of the first AND gate is connected to the all-gate-on control signal line, and an output end of the first AND gate is connected to an input end of the first one of the at least one third inverter;

the second enable and output module further comprises a second AND gate, and the second AND gate is connected between the second NAND gate and a first one of the at least one sixth inverter; and a first input end of the second AND gate is connected to the output end of the second NAND gate, a second input end of the second AND gate is connected to the all-gate-on control signal line, and an output end of the second AND gate is connected to an input end of the first one of the at least one sixth inverter.

13. The display panel according to claim 1, further comprising a second clock signal line and a third clock signal line;

each of the plurality of second shift registers comprises a third clock signal input end, a first output end and a second output end;

the first output end of the each of the plurality of second shift registers is connected to a respective one of the plurality of scanning lines in the second display area; and the second output end of the each of the plurality of second shift registers is connected to a respective one of the plurality of fingerprint identification units.

14. The display panel according to claim 13, further comprising a third control signal line and a fourth control signal line;
wherein, each of the plurality of second shift registers further comprises a third input module, a third shift module and a third enable and output module;

the third input module comprises a first input end, a second input end, a third input end and a fourth input end;

the first input end of the third input module is connected to the third control signal line, the second input end of the third input module serves as the second trigger signal input end of the respective one of the plurality of second shift registers, the third input end of the third input module is connected to the fourth control signal line, and the fourth input end of the third input module serves as the third trigger signal input end of the respective one of the plurality of second shift registers;

the third input module is configured to output a shift control signal;

the third shift module comprises a first clock signal input end, a first input end and an output end;

the input end of the third shift module is connected to the output end of the third input module; and the third shift module is configured to output a shift signal according to the shift control signal input by the first input end of the third shift module and a clock signal input by the first clock signal input end of the third shift module;

the third enable and output module comprises a second clock signal input end, a third clock signal input end, an input end, a first output end and a second output end;

the second clock signal input end of the third enable and output module is connected to the second clock signal line, the third clock signal input end of the third enable and output module is connected to the third clock signal line, and the input end of the third enable and output module is connected to the output end of the third shift module;

the third enable and output module is configured to output a scanning signal on the first output end of the third enable and output module according to the shift signal input by the input end of the third enable and output module and a clock signal input by the second signal input end of the third enable and output module, and further configured to output a control signal on the second output end of the third enable and output module according to the shift signal input by the input end of the third enable and output module and a clock signal input by the third clock signal input end of the third enable and output module; and the first output end of the third enable and output module serves as the first output end of the respective one of the plurality of second shift registers, and the second output end of the third enable and output module serves as the second output end of the respective one of the plurality of second shift registers.

15. The display panel according to claim 14, wherein the third input module further comprises a seventh transistor, an eighth transistor, a ninth transistor and a tenth transistor;

a first electrode of the seventh transistor and a first electrode of the eighth transistor are connected to the second trigger signal input end, and a second electrode of the seventh transistor is connected to a second electrode of the eighth transistor;

a gate of the seventh transistor and a gate of the ninth transistor are connected to the third control signal line, and a gate of the eighth transistor and a gate of the tenth transistor are connected to the fourth control signal line;

a first electrode of the ninth transistor and a first electrode of the tenth transistor are connected to the third trigger signal input end;

a second electrode of the ninth transistor and a second electrode of the tenth transistor are connected to the second electrode of the seventh transistor;

the third shift module further comprises a seventh inverter, an eighth inverter, a fifth clock inverter and a sixth clock inverter;

an input end of the seventh inverter is connected to the first clock signal input end;

an input end of the fifth clock inverter is electrically connected to the second electrode of the seventh transistor, a first control end of the fifth clock inverter is electrically connected to an output end of the seventh inverter, a second control end of the fifth clock inverter is electrically connected to the first clock signal input end, and an output end of the fifth clock inverter is electrically connected to an output end of the sixth clock inverter;

an input end of the sixth clock inverter is electrically connected to the output end of the seventh inverter, a first control end of the sixth clock inverter is electrically connected to the first clock signal input end, and a second control end of the sixth clock inverter is electrically connected to an output end of the eighth inverter;

an input end of the eighth inverter is connected to the output end of the fifth clock inverter, and the output end of the eighth inverter serves as the second trigger signal output end of the respective one of the plurality of second shift registers;

the third enable and output module further comprises a third NAND gate, a fourth NAND gate, at least one ninth inverter and at least one tenth inverter;

a first input end of the third NAND gate is electrically connected to the second clock signal input end, a second input end of the third NAND gate is electrically connected to the output end of the eighth inverter, and the at least one ninth inverter is sequentially connected in series between an output end of the third NAND gate and the first output end of the respective one of the plurality of second shift registers; and a first input end of the fourth NAND gate is electrically connected to the third clock signal input end, a second input end of the fourth NAND gate is electrically connected to the output end of the eighth inverter, and the at least one tenth inverter is sequentially connected in series between an output end of the fourth NAND gate and the second output end of the respective one of the plurality of second shift registers.

16. The display panel according to claim 1, wherein first shift registers, each of which is connected to a respective one of the plurality of scanning lines in the first display area, are disposed on one side of the first display area, or two opposite sides of the first display area.

17. A display device, comprising a display panel wherein the display panel comprises a display area and a non-display area, and a plurality of cascaded shift registers disposed in the non-display area and a plurality of scanning lines disposed in the display area;

each of the plurality of shift registers is connected to a respective one of the plurality of scanning lines;

the plurality of shift registers comprise a plurality of first shift registers and a plurality of second shift registers, the plurality of first shift registers are capable of unidirectional scanning, and the plurality of second shift registers are capable of bidirectional scanning; and the display area comprises a first display area and a second display area, each of scanning lines in the first display area is connected to a respective one of the plurality of first shift registers, and each of at least part of scanning lines in the second display area is connected to a respective one of the plurality of second shift registers;

wherein the second display area is a special-shaped display area;

the plurality of first shift registers constitute at least one first shift register group, and first shift registers in each of the at least one first shift register group are cascaded; the plurality of second shift registers constitute at least one second shift register group, and second shift registers in each of the at least one second shift register group are cascaded; and on a same side of the display area, a first-stage first shift register in one of the at least one first shift register group and a last-stage second shift register in one of the at least one second shift register group are cascaded; or a last-stage first shift register in the one of the at least one first shift register group and a first-stage second shift register in the one of the at least one second shift register group are cascaded;

the display panel further comprises a first start signal line and a second start signal line, wherein each of the plurality of first shift registers comprises a first trigger signal input end and a first trigger signal output end; each of the plurality of second shift registers comprises a second trigger signal input end, a third trigger signal input end and a second trigger signal output end;

in two adjacent stages of the plurality of first shift registers, the first trigger signal input end of a succeeding one of the two adjacent stages of the plurality of first shift registers is connected to the first trigger signal output end of a preceding one of the two adjacent stages of the plurality of first shift registers; and in two adjacent stages of the plurality of second shift registers, the second trigger signal input end of a succeeding one of the two adjacent stages of the plurality of second shift registers is connected to the second trigger signal output end of a preceding one of the two adjacent stages of the plurality of second shift registers, and the second trigger signal output end of the succeeding one of the two adjacent stages of the plurality of second shift registers is connected to the third trigger signal input end of the preceding one of the two adjacent stages of the plurality of second shift registers; and on one side of the display area, the first trigger signal input end of a first stage of the plurality of first shift registers is connected to the first start signal line; the second trigger signal input end of a first stage of the plurality of second shift registers is connected to the first trigger signal output end of a last stage of the plurality of first shift registers, and the third trigger signal input end of a last stage of the plurality of first shift registers is connected to the second start signal line.

* * * * *